United States Patent
Yamamoto et al.

(10) Patent No.: US 11,970,390 B2
(45) Date of Patent: Apr. 30, 2024

(54) METHOD FOR PRODUCING MICROCHANNEL DEVICE

(71) Applicant: CANON KABUSHIKI KAISHA, Tokyo (JP)

(72) Inventors: Takeshi Yamamoto, Kanagawa (JP); Jun Miura, Kanagawa (JP); Keiji Miyazaki, Tokyo (JP); Hiroki Tanaka, Kanagawa (JP); Makoto Fukatsu, Shizuoka (JP); Akihisa Matsukawa, Tokyo (JP); Takayuki Kanazawa, Kanagawa (JP); Keigo Mizusawa, Kanagawa (JP); Masanori Seki, Kanagawa (JP); Masanori Tanaka, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 130 days.

(21) Appl. No.: 17/677,181

(22) Filed: Feb. 22, 2022

(65) Prior Publication Data

US 2022/0177300 A1 Jun. 9, 2022

Related U.S. Application Data

(63) Continuation of application No. PCT/JP2020/031882, filed on Aug. 24, 2020.

(30) Foreign Application Priority Data

Aug. 29, 2019 (JP) .................. 2019-156718
Jul. 31, 2020 (JP) .................. 2020-130484

(51) Int. Cl.
*B81C 1/00* (2006.01)
(52) U.S. Cl.
CPC ...... *B81C 1/00071* (2013.01); *B81C 1/00206* (2013.01)

(58) Field of Classification Search
CPC .................. B81C 1/00071; B81C 1/00206
See application file for complete search history.

(56) References Cited

U.S. PATENT DOCUMENTS

| 8,747,079 B2 | 6/2014 | Tokita et al. |
| 8,852,526 B2 | 10/2014 | Shen et al. |

(Continued)

FOREIGN PATENT DOCUMENTS

| CN | 101652661 | 2/2010 |
| CN | 101652661 A | 2/2010 |

(Continued)

OTHER PUBLICATIONS

International Preliminary Report on Patentability in International Application No. PCT/JP2020/031882 (dated Mar. 2022).

(Continued)

*Primary Examiner* — Jason L Vaughan
*Assistant Examiner* — Amanda Kreiling
(74) *Attorney, Agent, or Firm* — Venable LLP

(57) ABSTRACT

The present disclosure provides a method for producing a microchannel device, which can form a channel that has high hydrophobicity, high solvent resistance as well, and also resistance to heat and damage, on demand with high accuracy, and produces the microchannel device at a low cost, while having high productivity. The method for producing a microchannel device includes: forming a channel pattern from a hydrophobic resin on a porous substrate by an electrophotographic method; melting the channel pattern by heat to allow the channel pattern to permeate into the porous substrate, thereby forming a channel in the inside of the porous substrate.

11 Claims, 16 Drawing Sheets

(56) References Cited

U.S. PATENT DOCUMENTS

| | | | |
|---|---|---|---|
| 9,266,105 B2 | 2/2016 | Beachner et al. | |
| 9,365,019 B2 | 6/2016 | Zhou et al. | |
| 9,415,610 B2 | 8/2016 | O'Neil et al. | |
| 9,480,980 B2 | 11/2016 | Zhou et al. | |
| 9,586,204 B2 | 3/2017 | Hong et al. | |
| 9,686,540 B2 | 6/2017 | Zhou et al. | |
| 9,933,359 B2 | 4/2018 | Zehler et al. | |
| 10,175,162 B2 | 1/2019 | Jia et al. | |
| 2007/0015179 A1 | 1/2007 | Klapperich et al. | |
| 2012/0198684 A1 | 8/2012 | Carrilho et al. | |
| 2015/0367340 A1* | 12/2015 | Beachner | B32B 7/12 422/430 |
| 2016/0008812 A1 | 1/2016 | Kobayashi | |
| 2016/0207038 A1 | 7/2016 | Vella et al. | |
| 2022/0168731 A1 | 6/2022 | Yamamoto et al. | |

FOREIGN PATENT DOCUMENTS

| | | | |
|---|---|---|---|
| CN | 102119056 | | 7/2011 |
| CN | 102119056 A | | 7/2011 |
| CN | 102914536 A | | 2/2013 |
| CN | 105008932 | | 10/2015 |
| CN | 105008932 A | | 10/2015 |
| CN | 105269915 | | 1/2016 |
| CN | 105269915 A | | 1/2016 |
| CN | 107754961 A | | 3/2018 |
| CN | 108940389 A | | 12/2018 |
| EP | 2 960 055 A2 | | 12/2015 |
| JP | 2013-534632 A | | 9/2013 |
| JP | 2014-40061 A | | 3/2014 |
| JP | 2015-007604 A | | 1/2015 |
| JP | 2015-052584 A | | 3/2015 |
| JP | 2015-131257 A | | 7/2015 |
| JP | 2016-7857 A | | 1/2016 |
| JP | 5935153 B2 | | 6/2016 |
| JP | 2016-539343 A | | 12/2016 |
| WO | 99/29497 A1 | | 6/1999 |
| WO | WO-9929497 A1 * | 6/1999 | ........ B01L 3/502707 |
| WO | 2010/125297 A1 | | 11/2010 |
| WO | 2012/004353 A1 | | 1/2012 |
| WO | 2013/065000 A1 | | 5/2013 |
| WO | 2015/031849 A1 | | 3/2015 |
| WO | 2020/079708 A1 | | 4/2020 |
| WO | 2021/039728 A1 | | 3/2021 |
| WO | 2021/039740 A1 | | 3/2021 |

OTHER PUBLICATIONS

Examination Report in Indian Application No. 202247014746 (dated Aug. 2022).
Office Action in Canadian Application No. 3150966 (dated Mar. 2023).
Piotr Lisowski et al., "Microfluidic Paper-Based Analytical Devices (IPADs) and Micro Total Analysis Systems (ITAS): Development, Applications and Future Trends," 76 Chromatographia 1201-1214 (Feb. 2013) (XP055221665).
Extended European Search Report in European Application No. 20856776.8 (dated Aug. 2023).
First Office Action in Chinese Application No. 202080060412.8 (dated Feb. 2023).
Yamamoto et al., U.S. Appl. No. 17/674,060, filed Feb. 17, 2022.
International Search Report in International Application No. PCT/JP2020/031882 (dated Oct. 2020).
James S. Ng et al., "Fabrication of Paper Microfluidic Devices Using a Toner Laser Printer," 10 RSC Adv. 29797-29807 (Aug. 2020) (with Supplementary Information, pp. 1-5).
Rajesh Ghosh et al., "Fabrication of Laser Printed Microfluidic Paper-Based Analytical Devices (LP-µPADs) for Point-of-Care Applications," 9(1) Sci. Rep. 7896: 1-11 (May 2019).
Office Action in Canadian Application No. 3,150,966 (dated Dec. 2023).

* cited by examiner

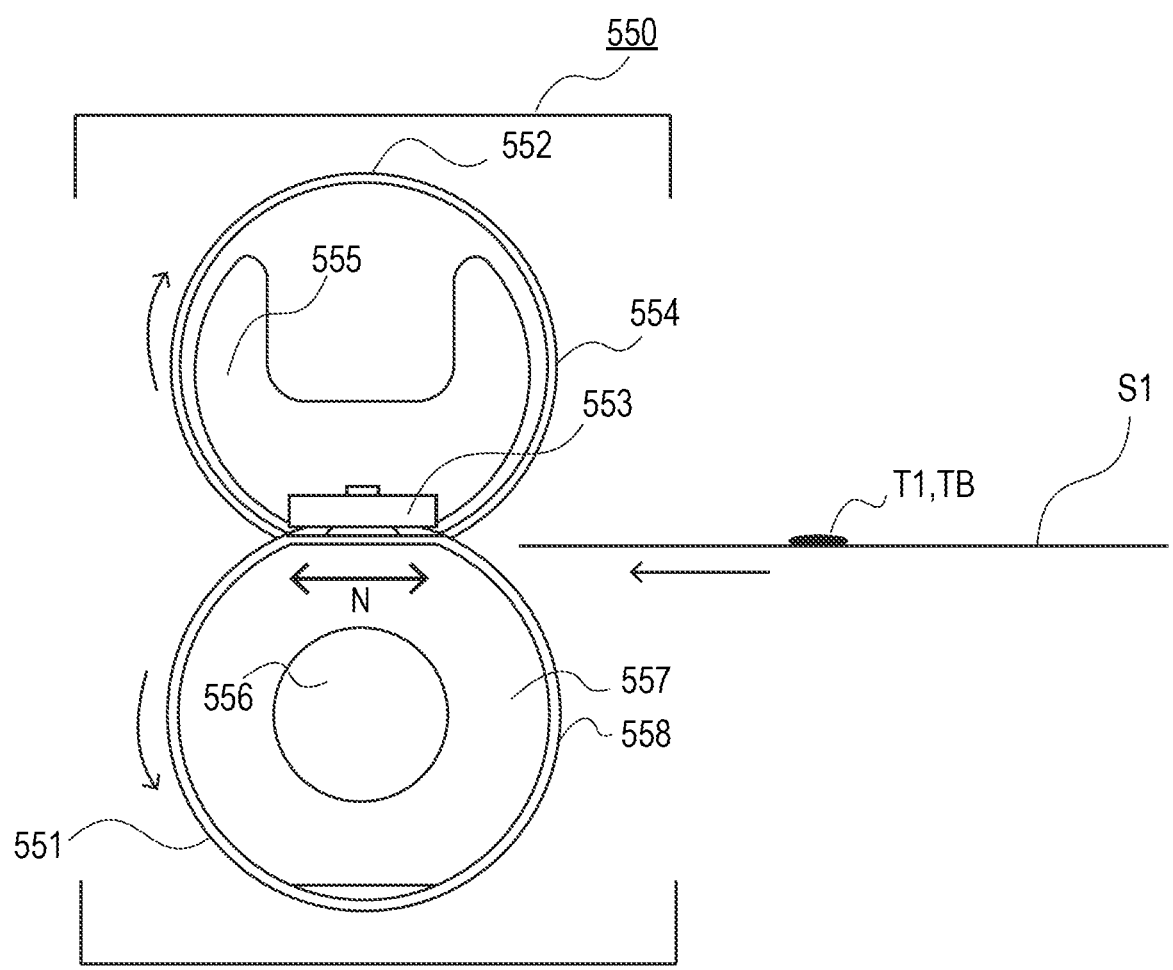

METHOD FOR PRODUCING MICROCHANNEL DEVICE

CROSS-REFERENCE TO RELATED APPLICATIONS

This application is a Continuation of International Patent Application No. PCT/JP2020/031882, filed Aug. 24, 2020, which claims the benefit of Japanese Patent Application No. 2019-156718, filed Aug. 29, 2019 and Japanese Patent Application No. 2020-130484, filed Jul. 31, 2020, all of which are hereby incorporated by reference herein in their entirety.

BACKGROUND OF THE INVENTION

Field of the Invention

The present disclosure relates to a method of producing a device that has a micro channel formed in the inside of a porous substrate.

Description of the Related Art

In recent years, the development of a microchannel device that can efficiently (in trace amount, quickly and simply) perform an analysis in biochemistry in one chip, with the use of a fine channel of a micro size, has been attracting attention in a wide range of fields such as biochemical research, medical care, drug discovery, health care, environment and foods. Among the microchannel devices, a paper micro-analysis chip based on paper has advantages of light weight and low cost compared with conventional devices, has no need of using a power source, and further, also has high disposability. For this reason, the paper micro-analysis chip is expected to serve as an inspection device for medical activities in developing countries and remote areas where medical facilities are not well arranged and in disaster sites, and for airports and the like where the spread of infectious diseases must be stopped at the water's edge. In addition, the paper micro-analysis chip is attracting attention also as a health care device that can manage and monitor one's own health condition, because of being inexpensive and easy to handle.

In the early 1990s, a micro-analysis chip was developed that had a fine channel of a micro size formed on glass or silicon with the use of a photolithography method, a mold or the like, and carried out pretreatment, stirring, mixing, reaction and detection of a sample, on one chip. As a result, the micro-analysis chip realized miniaturization of the inspection system, quick analysis, and the reduction of a specimen, a reagent and a waste liquid. However, though the micro channel produced with the use of these photolithography technologies has high accuracy, the production cost thereof becomes high, and because of being difficult to incinerate, the disposability thereof becomes low. In addition, when an inspection liquid is sent into the micro channel, an auxiliary apparatus such as a syringe pump is necessary; accordingly, the use of the micro channel is limited to an environment in which facilities are arranged; and the micro channel has been mainly used in research institutions of biochemical systems.

Though there have been these problems, the paper micro-analysis chip uses an inexpensive material such as paper or cloth as a substrate, also can drive a specimen or the inspection liquid by utilizing a capillary phenomenon of the material itself, and can be used at low cost and in a non-electric environment. In addition, transportation (distribution) is easy, and the disposability is high (disposal is completed only by burning). Furthermore, the apparatus does not need maintenance, and accordingly, it becomes possible to easily realize diagnosis by POC (point of care) at a low cost, by anyone (even an elderly person or a child having no knowledge), and in any place (regardless of a place including a place where there is no power source). Therefore, research and development of paper micro-analysis chips for various infectious diseases, specific diseases, and health care (chronic disease management, health management) are currently being carried out by research institutions in the world.

Various techniques such as a photolithography method and a screen-printing method have been proposed, as a method for actually forming a micro channel (hereinafter, also simply referred to as a "channel") on paper. As described above, in the method of forming the channel by the photolithography method, there are many process steps such as mask exposure and etching treatment, and the cost becomes high; and in printing, an on-demand property is low; and accordingly, in recent years, a method of forming the channel by an ink jet printer has been proposed.

In Japanese Patent Application Laid-Open No. 2015-52584, there is proposed a method of forming the channel in the inside of a filter paper with the use of a commercially available inkjet printer. However, this technique includes coating the whole surface of the filter paper with polystyrene or the like, and then forming the channel with a solvent such as chloroform or the like; and accordingly, there is a case where safety for the user is impaired, and there is a possibility that the channel itself is contaminated by the solvent.

Therefore, in recent years, as described in Japanese Patent No. 5935153, there is proposed a technique of forming the channel with the use of a UV curable resin for ink; and according to this technique, the channel can be freely designed, and a channel can be formed that is high in rigidity and solvent resistance. However, in this method, the UV resin impregnated inside the paper must be cured, and accordingly needs to be irradiated with ultraviolet rays of high energy and needs a curing time longer than that in usual curing; and the method results in a channel forming technique which is disadvantageous in terms of productivity and cost.

In addition, the inkjet method forms a pattern (hereinafter referred to as a "channel pattern") corresponding to the micro channel, by allowing a nozzle to eject ink by a piezo method or a thermal method, and accordingly must suppress the viscosity of a resin to be ejected low to some extent. Then, there are possibilities that the low-viscosity UV resin ejected onto the paper results in being diffused in a process of permeating into the inside of the paper, and that the diffusion affects the accuracy of the finished channel. For example, there is a case where an actual channel width becomes narrow by several hundreds of $\mu$m as compared with a target channel width, and accordingly, there is a problem in dimensional accuracy in the formation of a complicated channel or a high-definition channel. In addition, in the case of a resin having a low viscosity, it is difficult that a large amount of the resin is placed on paper by one ejection. Because of this, in order to place a large amount of the resin on paper, it is necessary to eject ink a plurality of times, or increase a size of a head, and such problems remain that productivity and resolution decrease.

In addition, there is a method of using a printer that can eject a high-viscosity ink and form high-definition dots, but it is known that by this method, a speed of forming a channel pattern becomes extremely slow, and the productivity of the channel remarkably decreases.

In addition, in U.S. Patent Application Publication No. 2012/0198684, there is proposed a method of causing an ink jet printer that uses a solid ink (wax ink) to impregnate the wax ink in a filter paper, and thereby forming a channel in the inside of a substrate. However, this method employs a technique of drawing a channel pattern by melting a solid wax and ejecting the melted wax; and accordingly, a substantial resolution is low, and the edge accuracy and the like of the channel pattern result in being low. In addition, a main component of a material forming the channel is wax, and accordingly there are possibilities that the heat resistance and the solvent resistance decreases, and that the fastness of the formed channel and the use thereof are restricted.

Furthermore, in Japanese Patent Application Laid-Open No. 2015-131257, there is proposed a method of permeating a thermoplastic material into a porous member by a thermal transfer type printer to thereby form a channel. In this method, a thermoplastic material can be used that has a relatively high melt viscosity as compared with the inkjet method, and accordingly the method appeals an effect of reducing blur or an unpermeated portion, but when a large amount of the thermoplastic material is transferred to paper, resolution is reduced due to thermal diffusion in some cases. Because of this, there have been still insufficient points for forming a wall (hereinafter, referred to as "channel wall") constituting a highly accurate micro channel. There have been still insufficient points for forming a highly accurate channel wall.

In view of the above, there is a demand for a technique for the production of the paper micro-analysis chip, which can form a channel that has high hydrophobicity, high solvent resistance as well, and also resistance to heat and damage, on demand with high accuracy (less blur in inside of paper), and at a low cost, while having high productivity.

In view of the above, the present disclosure proposes a technique of forming a channel in the inside of a substrate such as filter paper, with the use of an electrophotographic method, and satisfies the above demand.

However, in general, in image formation by electrophotography, a resin is designed so that toner does not penetrate into paper as much as possible so as to keep an image quality, and accordingly it is difficult to form a channel in the inside of paper with the use of a general toner. Furthermore, the general toner has a certain degree of hydrophobicity, but is not sufficient, and does not have a high solvent resistance as well; and accordingly cannot be used as it is for forming a channel wall, in consideration of exudation or the like.

Based on these circumstances, proposed is a method for producing a microchannel device that has a highly accurate channel formed with the use of the electrophotographic method. In addition, proposed is a method for producing a microchannel device with the use of a resin that can rapidly permeate into the inside of the substrate by heat melting and can form a channel with high accuracy.

The present disclosure is directed to providing a method that can form a channel which has high hydrophobicity, high solvent resistance as well, and also resistance to heat and damage, on demand with high accuracy, and produces a microchannel device at a low cost, while having high productivity.

SUMMARY OF THE INVENTION

According to one aspect of the present disclosure, there is provided a method for producing a microchannel device that has a channel sandwiched between channel walls formed in the inside of a porous substrate, including: placing a first hydrophobic resin on a surface of the porous substrate by an electrophotographic method, to form a channel pattern on the surface of the porous substrate; and melting the first hydrophobic resin by heat to allow the first hydrophobic resin to permeate into the inside of the porous substrate, thereby forming the channel wall in the inside of the porous substrate.

According to another aspect of the present disclosure, there is provided a method for producing a microchannel device that has a channel sandwiched between channel walls formed in the inside of a porous substrate, including: placing a first hydrophobic resin on a surface of the porous substrate to form a channel pattern on the surface of the porous substrate; and melting the first hydrophobic resin by heat to allow the first hydrophobic resin to permeate into the inside of the porous substrate, thereby forming the channel wall in the inside of the porous substrate, wherein, when the channel wall is formed, the first hydrophobic resin is allowed to permeate at a temperature at which a storage elastic modulus G' of the first hydrophobic resin is 14 Pa or lower, and a loss elastic modulus G" thereof is 10 Pa or higher.

Further features of the present invention will become apparent from the following description of exemplary embodiments with reference to the attached drawings.

BRIEF DESCRIPTION OF THE DRAWINGS

FIG. 14 is a schematic diagram of a fixing apparatus unit in Example 9.

DESCRIPTION OF THE EMBODIMENTS

Exemplary embodiments of the present disclosure will be described below with reference to the drawings. However, the following embodiments are merely examples, and the present disclosure is not limited to the contents of the embodiments. In addition, in each of the following figures, components that are not necessary for the description of the embodiments will be omitted from the figures.

In the present disclosure, firstly, a channel pattern is formed from a hydrophobic resin on a porous substrate by an electrophotographic method. Next, the channel pattern is melted by heat and is permeated into the porous substrate. In this way, a channel is formed in the inside of the porous substrate. Each component will be described below.

<Channel Pattern Forming Unit>

Figure 1:
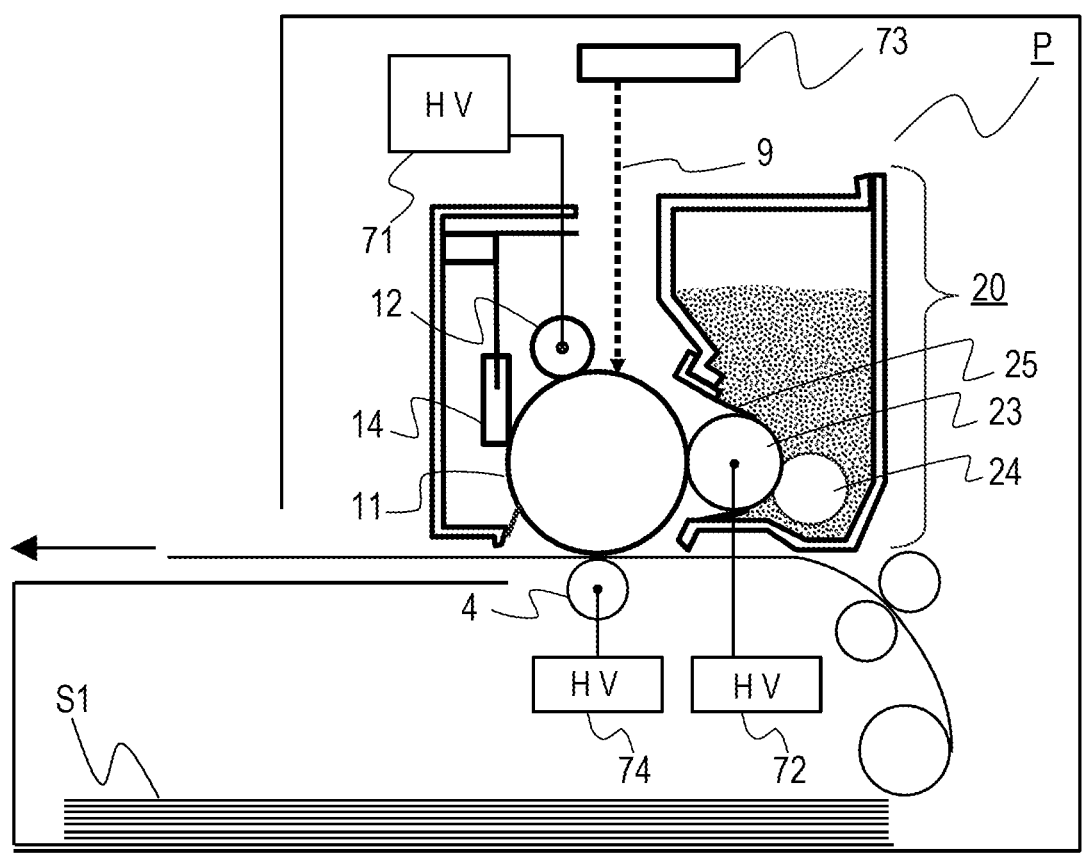
FIG. 1 is a schematic diagram of a channel pattern forming unit.
Figure 2:
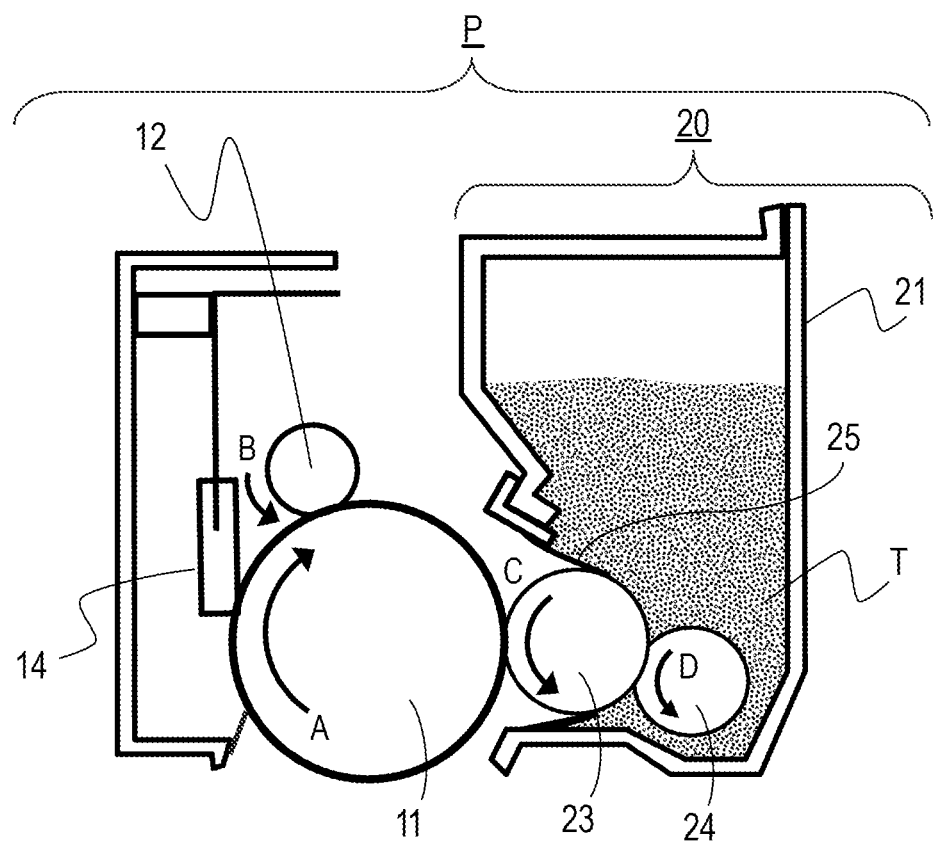
FIG. 2 is a schematic diagram of a process cartridge.
Figure 3:
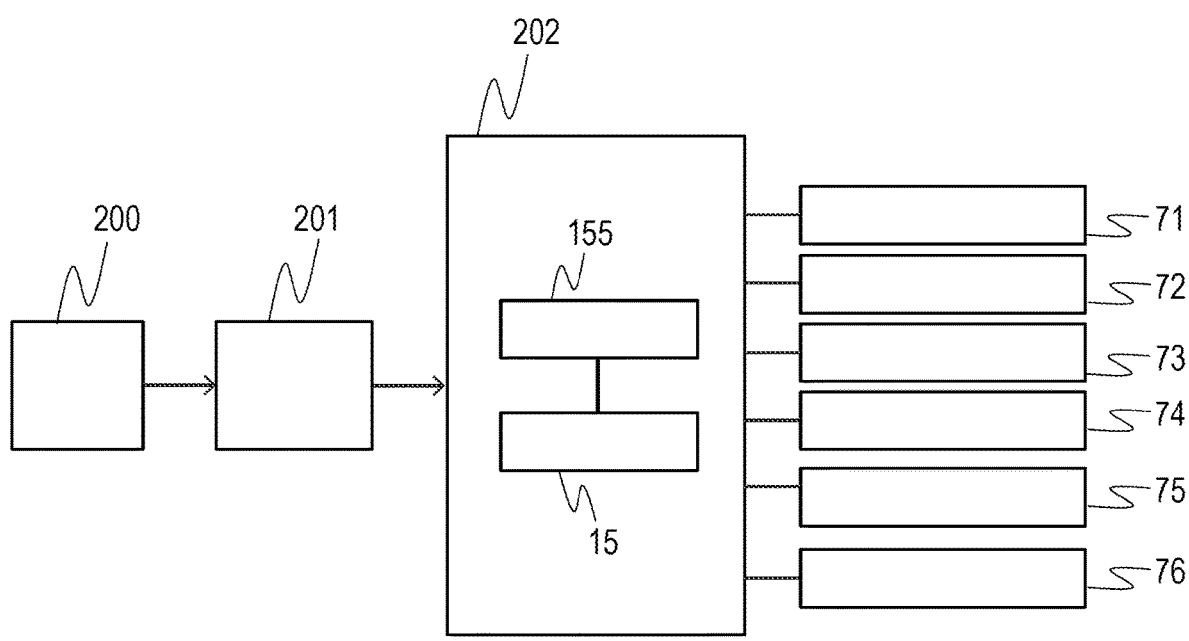
FIG. 3 is a block diagram illustrating a schematic control mode of a channel pattern forming unit.

The configuration of the whole channel pattern forming unit will be described with reference to FIG. 1 to FIG. 3. FIG. 1 is a cross-sectional view illustrating a schematic configuration of the channel pattern forming unit, and each configuration is schematically shown. FIG. 2 is a schematic sectional view of a process cartridge P. FIG. 3 is a block diagram illustrating a schematic control mode of a main part of the channel pattern forming unit.

Firstly, the configuration of the channel pattern forming unit, the channel pattern forming process, and each member will be described. Each member concerning the channel pattern forming process will be described according to an order of the channel pattern forming process, with reference to FIG. 1 and FIG. 2.

The channel pattern forming unit can accommodate a process cartridge P. Because of this, maintenance is easy by replacing the whole process cartridge P, and convenience is satisfactory. The process cartridge P includes a photosensitive drum 11 as an image bearing member. A charging roller 12, a developing apparatus 20 and a cleaning member 14 are provided around the photosensitive drum 11. The charging roller 12 is a roller-shaped charging member for charging the surface of the photosensitive drum 11. The developing apparatus 20 develops an electrostatic latent image formed on the surface of the photosensitive drum 11 by resin particles of a developer. The cleaning member 14 cleans a surface of the photosensitive drum 11. A voltage necessary for forming the channel pattern can be applied by a charging high-voltage power source 71, a developing high-voltage power source 72, and a transfer high-voltage power source 74, and is controlled by a control unit 202 (FIG. 3). In addition, the channel pattern forming unit drives the photosensitive drum 11 of the process cartridge P by a motor M1 (unillustrated), and can drive the developing apparatus 20 of the process cartridge P by a motor M2 (unillustrated).

When the channel pattern formation starts, the photosensitive drum 11 is rotated by driving of the motor M1 in a direction indicated by an arrow A in FIG. 2, and the charging roller 12 is rotated by the rotation of the photosensitive drum 11 in a direction indicated by an arrow B in FIG. 2. For information, in Example described later, a process speed of the photosensitive drum 11 was set at 150 mm/sec.

The photosensitive drum 11 has a configuration in which a photosensitive material such as OPC, amorphous selenium and amorphous silicon is provided on a cylinder-liked drum formed from aluminum, nickel, or the like. In Examples described later, the outer diameter was set to 20 mm, and a thickness of the photosensitive material was set to 13 μm.

As the charging roller 12 serving as the charging member, a single-layer roller can be used that includes an electroconductive mandrel (electroconductive metal core) and an electroconductive rubber layer. Then, a voltage is applied to the charging roller 12 by a charging high-voltage power source 71 that is a voltage applying unit. Subsequently, the charging roller to which the voltage is applied is brought into contact with the photosensitive drum 11, and a surface of the photosensitive drum 11 is uniformly charged. A DC (direct current) voltage is applied to the charging roller 12, and the photosensitive drum 11 is uniformly charged to the charging potential Vd by electric discharge. Vd at this time is referred to as a dark potential, and is −460V. For information, in Examples described later, the single-layer roller was used that had an outer diameter of 7.5 mm and a volumetric resistance of $10^3$ Ω·cm to $10^6$ Ω·cm was used as the charging roller 12, and a DC voltage was applied thereto. In addition, the surface of the photosensitive drum was uniformly charged to −460 V (Vd: dark portion potential).

After the surface of the photosensitive drum 11 has been charged by the charging roller 12, the surface of the photosensitive drum 11 is irradiated with a laser beam 9 emitted from an exposure unit 73. On the surface of the photosensitive drum 11 irradiated with the laser beam 9, the surface potential changes to V1 which is a light portion potential, and the electrostatic latent image is formed. For information, in Examples described later, V1 was set at −100V. As shown in FIG. 3, into the exposure unit 73, time-series electrical digital pixel signals of an image (channel pattern) information are input which has been input into the control unit 202 from a controller 200 via an interface 201, and has been subjected to image processing therein. The exposure unit 73 includes a laser output unit that outputs the laser beam 9 modulated so as to correspond to the time-series electrical digital pixel signals to be input, a rotating polygon mirror (polygon mirror), an fθ lens, and a reflecting mirror; and subjects the surface of the photosensitive drum 11 to main scanning exposure by the laser beam 9. Due to this main scanning exposure and sub-scanning by the rotation of the photosensitive drum 11, the electrostatic latent image corresponding to the image (channel pattern) information is formed on the photosensitive drum 11.

<Channel Pattern Forming Process>

The channel pattern forming unit has a contact/separation unit 75 that controls a position of the developing apparatus 20, and can control the position of the developing apparatus 20 to different positions at the time when the channel pattern is formed and at the time when the channel pattern is not formed. An operation of the contact/separation unit 75 is controlled by the control unit 202 shown in FIG. 3.

After the photosensitive drum 11 has started rotating, the developing apparatus 20 moves a developing roller 23 of a developer bearing member by the contact/separation unit 75, which has been separated from the photosensitive drum 11, so as to come into contact with the photosensitive drum 11.

Subsequently, the developing roller 23 starts rotating in the direction of the arrow C in FIG. 2, and a resin-particle supplying roller 24 of a resin-particle supplying member starts rotating in the direction of arrow D in FIG. 2, by the driving of motors M2 which are connected to the rollers, respectively. Then, due to a voltage of −300V, which is applied as the developing voltage from the developing high-voltage power source 72 for the developing roller 23 to the developing roller 23, resin particles as a developer are supplied by the developing roller 23 to the electrostatic latent image that is formed on the photosensitive drum 11, in other words, the above V1 portion, and the electrostatic latent image is developed. For information, a ratio between a moving velocity of the surface of the photosensitive drum 11 and a moving velocity of the surface of the developing roller 23 (moving velocity of surface of developing roller 23/moving velocity of surface of photosensitive drum 11) at this time is referred to as a developing peripheral speed ratio. An amount of the developer to be developed on the photosensitive drum 11 can be controlled by the control of the developing peripheral speed ratio. For example, if the developing peripheral speed ratio is 2.5, in a case where all the developer on the developing roller 23 is developed on the photosensitive drum 11, the amount of the developer per unit area on the surface of the photosensitive drum 11 becomes 2.5 times the amount of the developer per unit area on the surface of the developing roller 23. In Examples described later, the developing peripheral speed ratio is controlled by a velocity of the motor M2 so that a developer amount suitable for forming a micro-channel wall in the inside of the porous substrate S1 can be supplied to the photosensitive drum.

The developer image (resin-particle image) is transferred to the porous substrate S1 of a recording medium, by a potential difference between the developer image and a transfer roller 4 to which a transfer voltage is applied by the transfer high-voltage power source 74. The porous substrate S1, which will be described later, is a sheet-like medium that is porous. In Examples described later, a roller was used as the transfer roller 4, which had the elastic layer of a semiconductive sponge on the electroconductive metal core, which mainly contained NBR hydrin rubber of an elastic body and of which the resistance was adjusted with the use of an ion conductive material. An outer diameter of the transfer roller 4 and the electroconductive metal core were set to 12.5 mm and 6 mm, respectively, and the transfer voltage of +2000V was applied. In addition, the resistance value of the transfer roller which was used in Examples was as follows, when +2000V was applied.

Under a normal temperature and normal humidity environment at a temperature of 23° C. and a relative humidity of 50%: $1.0 \times 10^8 \Omega$ to $3.0 \times 10^8 \Omega$ Under a high temperature and high humidity environment at a temperature of 32° C. and a relative humidity of 80%: $0.5 \times 10^8 \Omega$ Under a low temperature and low humidity environment at a temperature of 15° C. and a relative humidity of 10%: $8.0 \times 10^8 \Omega$ The porous substrate S1 onto which the developer image has been transferred is discharged to the outside of the channel pattern forming unit, in such a state that the developer image remains on the upper side in the direction of gravity. In addition, the developer that has not been transferred, on the photosensitive drum 11 which has passed the transfer roller 4, is scraped off by the cleaning member 14 in contact with the photosensitive drum 11. After that, the process beginning from the charging by the charging roller 12 is repeated again, and the channel pattern is continuously formed.

After the channel pattern formation has been completed, the developing roller 23 is separated from the photosensitive drum 11 by the contact/separation unit 75, and a post-rotation operation is performed; and thereby a state in the channel pattern forming unit is reset, and the channel pattern forming unit gets ready so as to be capable of quickly printing when forming the channel pattern next. After the developing roller 23 has been separated from the photosensitive drum 11 by the contact/separation unit 75, the driving of the motor M2 is turned off, and thereby, the deterioration of the developer can be suppressed.

Next, an operation control of the channel pattern forming unit will be described with reference to FIG. 3. The control unit 202 controls an operation of the channel pattern forming unit, and transmits and receives various electrical information signals. In addition, the control unit 202 performs processing of electrical information signals that are input from various process equipment and sensors, and processing of command signals to various process equipment. The controller 200 transmits and receives various electrical information to and from a host apparatus, and integrally controls a channel pattern forming operation of the channel pattern forming unit by the control unit 202 via the interface 201, according to a predetermined control program or a reference table. The control unit 202 includes a CPU 155 that is a central element for performing various arithmetic processes, and a memory 15 such as a ROM and a RAM which are storage elements. In the RAM, there are stored a detection result of a sensor, a count result of a counter, a computation result and the like, and in the ROM, there are stored a control program, a data table that is obtained in advance by an experiment and the like. To the control unit 202, there are connected control targets, sensors, counters and the like in the channel pattern forming unit. The control unit 202 controls transmission and reception of various electrical information signals, timing of driving of each unit, and the like, and thereby performs the control of a predetermined channel pattern formation sequence, and the like. The control unit 202 controls, for example, the charging high-voltage power source 71, the developing high-voltage power source 72, the exposure unit 73, the transfer high-voltage power source 74, a developing peripheral speed changing unit 76, and the like, and thereby adjusts an applied voltage, an exposure amount and the like.

In the channel pattern forming unit of FIG. 1, respective connections from the control unit 202 to the charging high-voltage power source 71, the developing high-voltage power source 72, the exposure unit 73, and the transfer high-voltage power source 74 are not shown. However, actually, the charging high-voltage power source 71, the developing high-voltage power source 72, the exposure unit 73, and the transfer high-voltage power source 74 are connected to the control unit 202, and the control unit 202 controls each of the power sources and the unit. In addition, the channel pattern forming unit forms the channel pattern on the porous substrate S1, based on electrical channel pattern signals which are input into the controller 200 from a host apparatus. For information, examples of the host apparatus include an image reader, a personal computer (hereinafter, also referred to as PC), a facsimile and a smart phone.

<Developing Apparatus>

Next, a configuration of a portion associated with a developing process of the developing apparatus 20 according to the present disclosure will be described in detail with reference to FIG. 2.

The developing apparatus 20 includes a developing container 21 having an opening at a position facing the photosensitive drum 11, and resin particles are stored in the developing container 21 in place of toner which is used in an ordinary electrophotographic apparatus. The developing apparatus 20 includes the developing roller 23 and the resin-particle supplying roller 24.

The developing roller 23 has a role of conveying the resin particles to the electrostatic latent image on the photosensitive drum 11 while carrying the resin particles. As the developing roller 23, a roller can be used that has a surface layer in which roughening particles are dispersed, on the surface of an elastic layer. The conveyance property of the resin particles can be adjusted by a surface roughness of the developing roller 23. In Examples described later, the roller was used that had the surface layer in which particles having a diameter of 10 μm were dispersed while urethane rubber was used as a binder, on the surface of an elastic layer formed from silicone rubber. The surface roughness Ra was set to about 3.5 μm.

The resin-particle supplying roller 24 has a foam layer that rubs the surface of the developing roller 23, and has a role of supplying the resin particles in the developing container 21 to the developing roller 23. The resin-particle supplying roller 24 is electrically connected to the developing roller 23, and the electric potentials are equalized.

In addition, the developing apparatus 20 has a developing blade 25 serving as a resin-particle regulating member that regulates a coating amount of the resin particles which have been supplied to the developing roller 23. As the developing blade 25, a member can be used, for example, in which a thin stainless steel (SUS) plate is supported by a supporting metal plate. The developing blade 25 is electrically connected to the developing roller 23, and the electric potentials are equalized.

In Examples described later, as the developing blade 25, the member was used in which a stainless steel (SUS) plate having a thickness of 80 μm was supported by a supporting metal plate having a thickness of 1 mm. The tip of the SUS plate of the developing blade 25 was brought into contact with the developing roller 23 by a pressure of 25 to 35 g/cm. The direction of contact was set to a counter direction in which the tip of the free end side with respect to the contact portion was positioned on the upstream side in the rotation direction of the developing roller 23. Due to the above configuration, the surface of the developing roller 23 that has passed through the developing blade 25 is coated with the resin particles of 0.50 mg/cm² per unit area.

<Channel Pattern>

In Example 1 described later, a channel pattern 80 illustrated in FIG. 4A was formed by placing the resin particles on the porous substrate S1 and forming a resin-particle image, with the use of the channel pattern forming unit. The channel pattern 80 corresponds to a channel wall 81, a reagent portion 83 to which a reagent is attached, an inspection liquid portion 84 to which an inspection liquid is attached, and a channel 82 which connects the reagent portion 83 with the inspection liquid portion 84. However, the shape, size and the like of the channel pattern are of course not limited thereto, and may be a shape using a combination of a straight line and a curved line, or using a branch; and a width of the channel may be changed.

Figure 4A:
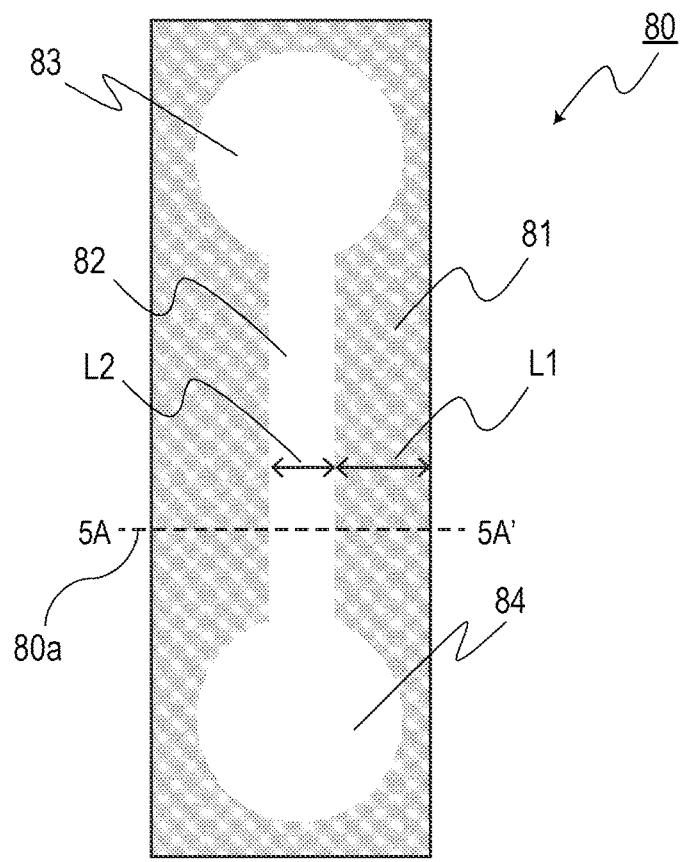
FIG. 4A is a view illustrating a channel pattern in Example 1.

In a case where the channel pattern of FIG. 4A is formed in Examples described later, the width L1 of the channel wall 81 sandwiching the channel 82 was set to 4 mm, and the width L2 of the channel 82 was set to 1.5 mm.

Figure 4B:
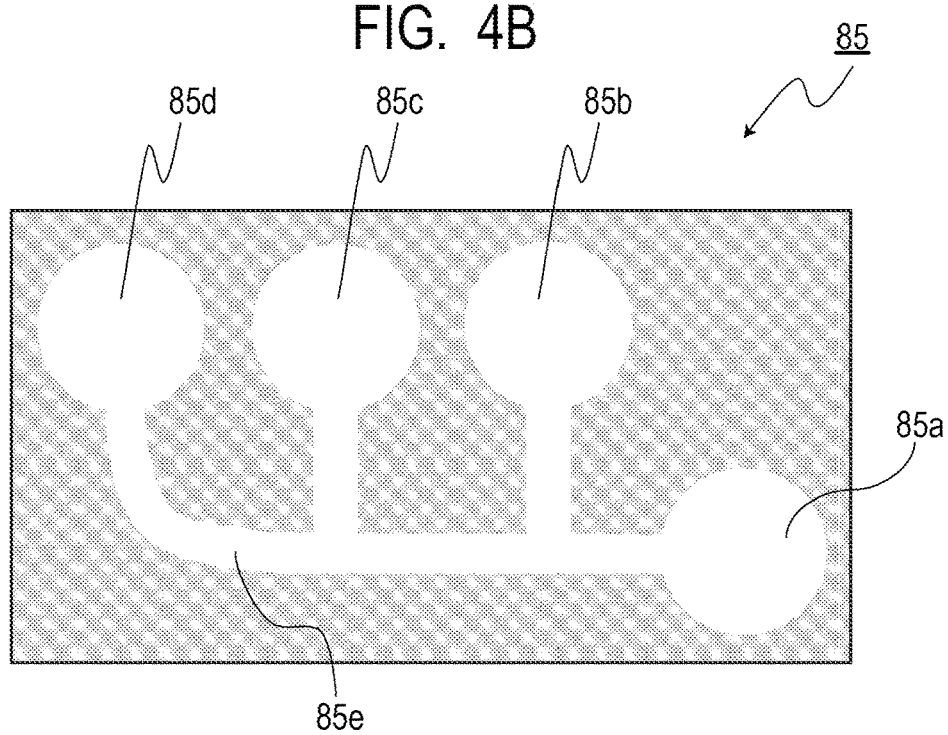
FIG. 4B is a view illustrating a channel pattern having a curve and a branch.

An example of a channel pattern 85 having a curve and a branch is illustrated in FIG. 4B. In this example, reagent portions 85b, 85c and 85d to which the respective reagents are attached, and an inspection liquid portion 85a to which an inspection liquid is attached are connected by a channel 85e.

<Heating Process>

The porous substrate S1 in which the channel pattern 80 has been formed passes a heating process by a heating unit, and thereby the resin particles are melted, permeate into the porous substrate S1, and form a microchannel device having a channel that is surrounded by a hydrophobic wall.

Therefore, the heating temperature needs to be controlled to a temperature at which the resin particles are melted and the melted resin permeates into the porous substrate S1. Physical properties of the resin particles will be described later, but in configurations of Examples described later, the resin particles melted at 140° C. or higher, and permeated into the porous substrate S1.

As for the heating time, a time period is required during which a molten resin completely finishes permeating into the thickness direction of the porous substrate S1, but if the heating time is too long, there is a possibility that the resin results in diffusing more than necessary, and the channel 82 after the heating process becomes thin, as compared with that of the formed channel pattern. Although depending on the heating temperature, an appropriate channel wall can be formed by the heating time set to 1 to 10 minutes.

In view of the above, the heating conditions in Examples described later were set to an environment at 200° C. for 2 minutes. An oven (Yamato Scientific Co., Ltd., air-blowing constant-temperature incubator DN610H) was used as the heating unit. However, the heating method is not limited to the oven, and a far infrared heater, a hot plate or the like may be used; and the heating conditions also should be selected according to the physical properties of the resin particle and the porous substrate S1.

The heating process under the above conditions will be described below with reference to FIGS. 5A and 5B.

Figure 5A:
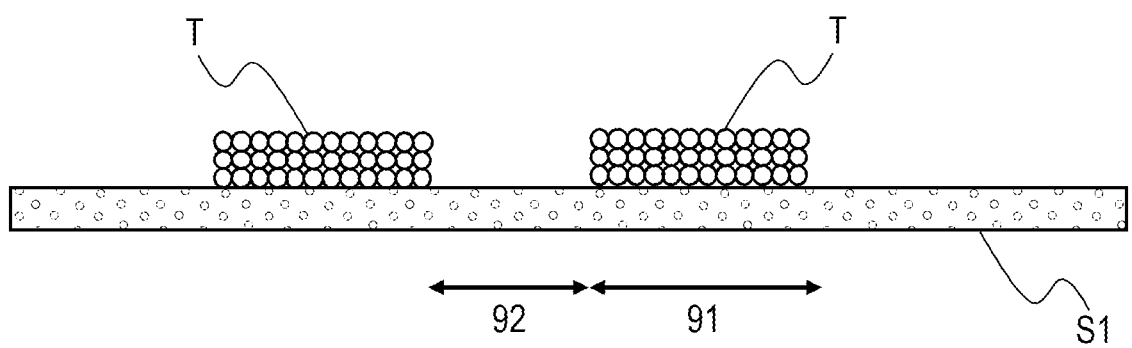
FIGS. 5A and 5B are explanatory diagrams illustrating channel formation in Example 1.
Figure 5B:
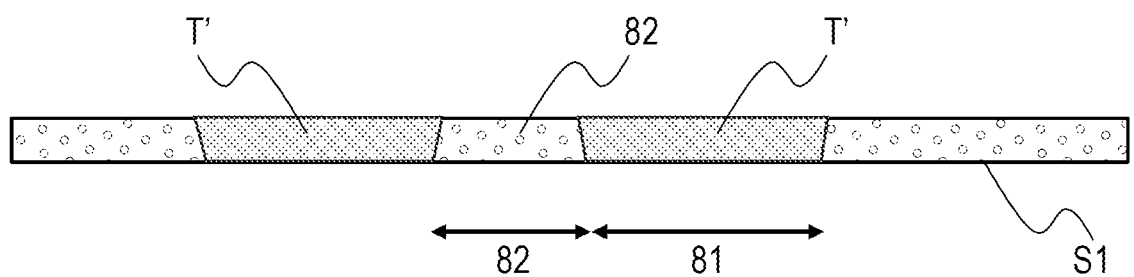

A schematic cross-sectional view taken along line 5A-5A' in FIG. 4A is illustrated in FIGS. 5A and 5B, as a view illustrating the resin particles before and after heating. FIG. 5A is a cross-sectional view before heating, and FIG. 5B is a cross-sectional view after heating.

As is illustrated in FIG. 5A, the resin particles T before heating merely attach to the surface of a region 91 which becomes the channel wall 81 of the porous substrate S1, and do not attach to a region 92 which becomes the channel 82. The resin particles T are melted by subsequent heating, and the melted resin particles T permeate into the inside of the porous substrate S1 due to a capillary phenomenon.

After heating at 200° C. for 2 minutes, as illustrated in FIG. 5B, a hydrophobic resin permeates in the thickness direction of the porous substrate S1, and the channel 82 is formed in the porous substrate S1, which is sandwiched between the resins T' that have permeated after melting.

As described above, by use of the channel pattern forming unit and the heating unit, the microchannel device can be produced that has the channel surrounded by the channel wall in the porous substrate S1.

In a case where the microchannel device is used that is prepared based on the channel pattern of FIG. 4A, for example, a reagent that shows a color reaction is attached to the reagent portion 83, and then an inspection liquid is attached to the inspection liquid portion 84. The attached inspection liquid diffuses to the reagent portion 83 through the channel 82. An inspection apparatus or an inspector may check the color reaction that occurs at that time. For example, in the case of inspection of a blood glucose level, blood can be used as the inspection liquid, and a mixed liquid of oxidase, peroxidase and potassium iodide can be used as the reagent. In the case of inspection of a uric acid level, blood can be used as the inspection liquid, and a mixed liquid of uricase, peroxidase and 4-aminoantipyrine can be used as the reagent.

A use example of the microchannel device that has been prepared based on the channel pattern of FIG. 4B will be described. A reagent a is attached to a reagent portion 85*b*, a reagent b is attached to a reagent portion 85*c*, and a reagent c is attached to a reagent portion 85*d*; and then an inspection liquid is attached to an inspection liquid portion 85*a*. Then, the inspection liquid that has been attached to the inspection liquid portion 85*a* permeates into a channel 85*e*, but is branched on the way; and thereby, the inspection liquid reacts only with the reagent a in the reagent portion 85*b*, reacts only with the reagent b in the reagent portion 85*c*, and reacts only with the reagent c in the reagent portion 85*d*. By use of the branched channel, reactions with a plurality of reagents can be simultaneously inspected. In addition, like the channel 85*e* at the portion heading for the inspection liquid portion 85*a*, the channel 85*e* is formed into a curved shape, and thereby accumulation of the inspection liquid in the edge portion can be eliminated or reduced.

<Developer>

Such characteristics of the developer will be described below as to be preferable when the microchannel device is prepared by the above process.

A resin constituting the channel wall of the microchannel device is required not to expand due to moisture in the air, and accordingly is required to have a certain degree of hydrophobicity. For this reason, resin particles composed of a hydrophobic resin are used as the developer. The hydrophobicity of the resin particles is preferably about 1% or lower as a water absorption rate. Furthermore, the water absorption rate is more preferably 0.1% or lower, because the lower the water absorption rate is, the more the inspection liquid can be prevented from exuding to the outside of the channel, and the influence on the inspection can be reduced.

In addition, the developer needs to have both characteristics that are suitable for the previously described channel pattern forming process, and characteristics of being melted in the heating process and rapidly permeating into the porous substrate due to a capillary phenomenon, without causing blur.

Specifically, resin particles may be used that contain a resin as a main component, which has characteristics of being melted in the heating process and rapidly permeating into the porous substrate S1 by the capillary phenomenon without causing blur, and may contain a charge control agent or the like as needed so as to obtain characteristics suitable for the channel pattern forming process.

In addition, in an inkjet type of printer, when ink is ejected from the head, the viscosity of the ink is required to be about 0.15 Pa·s. In addition, even in a thermal transfer type of printer, the material is required to be 1.6 Pa·s or lower. On the other hand, in the case of the electrophotographic method, even a material having a melt viscosity of 1000 Pa·s or higher at 100° C. can be used, a range of selection of materials is wide, and the electrophotographic method is also preferable from this viewpoint.

When the melt viscosity is low, it becomes easy for the resin particle to permeate into the inside of the porous substrate, but blur at the time of permeation becomes large. On the contrary, when the melt viscosity becomes high, it is considered that blur at the time of permeation becomes small, but it becomes difficult for the resin particle to permeate into the porous substrate. However, it has been found that both the permeability and the suppression of blur can be satisfactorily achieved by appropriately controlling the storage elastic modulus G' and the loss elastic modulus G" of the resin particle.

Examples of a resin that can achieve both of the permeability and the suppression of blur include a cyclic olefin copolymer (Cyclo Olefin Copolymer). The Cyclo Olefin Copolymer will be hereinafter referred to as "COC".

The characteristics of the COC for the channel pattern forming process will be described below. The COC has not only negative chargeability with respect to the developing blade 25 and the developing roller 23, but also has low water absorbability. Because of this, the resin particle containing the COC has high charge stability in the channel pattern forming process, and has high storage stability. In addition, a mechanical strength is high, and accordingly even in a case where the resin particle is repeatedly rubbed between the developing roller 23 and the developing blade 25, the resin particle resists causing a crack or deformation. As described above, the COC is suitable for the channel pattern forming process which uses the electrophotographic method. The proportion of the COC in the resin particle containing the COC is preferably 50% by mass or more.

There is a case where the microchannel device is required to have solvent resistance. The COC has high solvent resistance in addition to high hydrophobicity, and does not dissolve in various inspection liquids; and can form a channel by which such an inspection can be performed as not to cause leakage from the channel. Furthermore, as previously described, the COC has the high mechanical strength and is resistant to heat and damage, and accordingly, a microchannel device that is easy to handle can be prepared.

The resin particle A that is used in Example 1 to be described later is a particle which is produced in the following way.

(i) A pellet of the COC (TM grade produced by Polyplastics Co., Ltd., specific gravity=1.02, and copolymer of ethylene and norbornene (molar ratio 85:15)) is finely pulverized.

(ii) The finely pulverized product is classified so that the volume average particle size becomes 6 μm.

(iii) The classified particles are subjected to thermal spheroidizing treatment to obtain COC particles.

(iv) Into the thermally spheroidized COC particles, 1.6% by mass of hydrophobic silica particles having a number average particle size of 10 nm are externally added as an external additive.

The surface of the resin particle is coated with an external additive, and thereby a negative charging performance and fluidity can be enhanced. For information, the silica particles to be used as the external additive are subjected to hydrophobic treatment and the amount of the external addition is very small; and accordingly, the silica particles do not affect the channel at the time when the microchannel device is finally used. However, the amount of external addition and the substance to be externally added are not limited thereto, and may be appropriately selected according to the configuration of the developing apparatus such as the developer bearing member and a developer regulating member to be used.

For information, in general, the COC has a melt viscosity of about 1000 Pa·s even at 100° C., and accordingly, it is difficult to use the COC in an inkjet method, a thermal transfer method or the like.

In a case where the channel pattern is formed by the electrophotography, a size and a shape of the resin particle are required to be the same as those of general electrophotographic toner. Because of this, the size and the shape of the resin particle may be controlled so as to be similar to those of general electrophotographic toners.

<Porous Substrate>

It is preferable for the porous substrate to show an appropriate void ratio and hydrophilicity. An open-cell bubble structure and a network (nanofiber or the like) structure are satisfactory as the porous structure, and examples thereof include filter paper, plain paper, high-quality paper, watercolor paper, Kent paper, synthetic paper, a porous film of a synthetic resin, fabric, and fiber products. Among the examples, filter paper is preferable from the viewpoint of having high void ratio and satisfactory hydrophilicity.

The void ratio can be appropriately selected according to the purpose, but is preferably 20% to 90%. In the case where the void ratio is in this range, sufficient characteristics can be obtained also in terms of the permeability of the inspection liquid while the strength as the substrate of the microchannel device is sufficient.

The hydrophilicity of the substrate is a necessary property for a water-containing biological fluid of an inspection liquid such as blood, urine and saliva to be capable of diffusing into the substrate.

An average thickness of the porous substrate that is generally used is 0.01 mm to 0.3 mm. When the average thickness is 0.01 mm or thicker, the strength as a substrate is appropriate. When the average thickness is 0.3 mm or thinner, it is easy for the COC to permeate into the substrate, and it becomes easy to form the channel wall. However, the average thicknesses may be selected according to the application, and there is also a case where the substrate is used of which the thickness is as thick as about 0.6 mm.

The channel wall (hydrophobic wall) is formed by allowing a resin to permeate into the pores of the porous substrate and filling the pores with the resin, and accordingly, it is necessary to sufficiently fill the pores of the porous substrate with resin particles, in order to form a channel in which leakage or exudation is suppressed. On the other hand, if the amount of the resin is too large which permeates into the substrate, an excess resin results in spreading over the surface of the porous substrate or exuding out to the back surface. For this reason, it is necessary to adjust the amount of resin particles according to the void ratio, the thickness and the like of the porous substrate. In the electrophotography, an amount of the resin particles to be placed on the porous substrate when the channel pattern is formed can be easily adjusted, and a larger amount of the resin particles can be placed at one time, as compared with other methods. Because of this, the electrophotography can easily form a reliable channel, and is a preferable method also from this viewpoint.

The amount of the resin particles on the porous substrate can be appropriately adjusted by changing the amount (g/cm$^2$) of the resin particles per unit area on the developing roller 23, the developing peripheral speed ratio in the channel pattern forming unit, and the transfer high-voltage power source for transferring the resin particles on the surface of the photosensitive drums 11. In addition, it is not necessary to place the resin particles in an amount of completely filling the pores in the porous substrate, and the amount may be an amount by which the channel functions as a channel in which the leakage or the exudation is suppressed.

For example, as the porous substrate, three types of filter paper formed of cellulose fibers having a thickness of 20 μm and having different basis weights can be used as porous substrates S1-1, S1-2 and S1-3.

The apparent densities (g/cm$^3$) of the porous substrates S1-1, S1-2 and S1-3 can be calculated as (basis weight/thickness×1000), and the void ratio (%) can be calculated as ((true density−apparent density)/true density×100) (see Table 1).

TABLE 1

| | Basis weight (g/m$^2$) | Thickness (mm) | Apparent density (g/cm$^3$) | True density (g/cm$^3$) | Void ratio (%) |
|---|---|---|---|---|---|
| S1-1 | 80 | 0.08 | 1.00 | 1.5 | 33 |
| S1-2 | 55 | 0.08 | 0.69 | 1.5 | 54 |
| S1-3 | 30 | 0.08 | 0.38 | 1.5 | 75 |

<Viscoelastic Characteristics of Resin Particle>

The storage elastic modulus G' represents the elasticity of an object, and a low storage elastic modulus G' means that the deformation with respect to a certain load is large. In other words, in a case where the storage elastic modulus G' of the resin particle is low, it becomes easier for the resin particle to permeate into the porous substrate S1 when a permeation force due to the capillary phenomenon has acted in the porous substrate S1.

The loss elastic modulus G" represents the viscosity of an object, and a high loss elastic modulus G" of the resin particle means that the viscosity is high. The high viscosity means that when the velocity of a fluid is different at each point in the flow, the fluid has a strong property of equalizing and uniformizing the velocity. In other words, when the loss elastic modulus G" of the resin particle is high, the resin particles tend to move at the same velocity as their surroundings when permeating into the porous substrate; and accordingly, the permeation unevenness in the porous substrate S becomes small, and the blur is suppressed. Because of the temperature unevenness of the porous substrate, the size unevenness of spongy pores, and the like, unevenness occurs in the capillary force as well, and there is a case where the channel pattern results in being blurred. Because of this, it is preferable for the resin particle to have high viscosity at the temperature of the heat fixing process and be in a state of resisting causing the blur.

In other words, in order to form a satisfactory channel, it becomes important to perform the heating process at a temperature at which such melting characteristics are shown that the storage elastic modulus G' is low and the loss elastic modulus G" is high, and to allow the resin particles to permeate into the substrate.

Figure 6A:
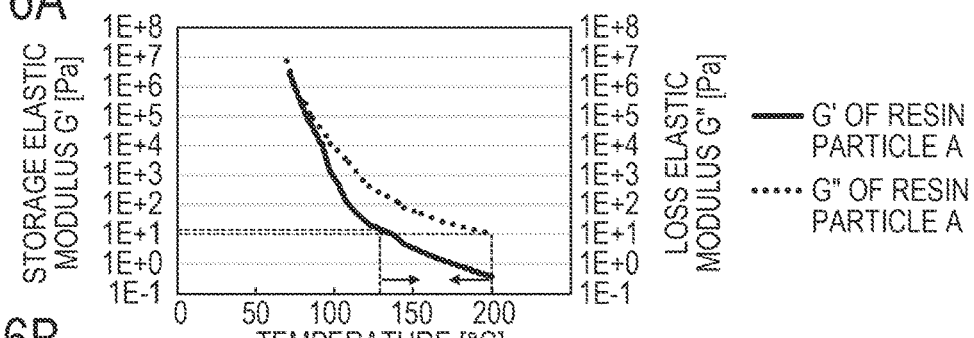
FIG. 6A is a temperature-dependent graph of a storage elastic modulus G' and a loss elastic modulus G" of a resin particle A.

Here, the viscoelastic characteristics necessary for allowing the resin particles to rapidly permeate into the porous substrate without causing the blur in the heating process will be described with reference to a graph of the modulus of elasticity of the resin particle A (FIG. 6A). For information, in FIGS. 6A to 6E, the description such as "1E+3" means "1×10$^3$". A solid line in FIG. 6A illustrates values of the storage elastic modulus G' of the resin particle A at the time when the temperature is varied, and a dotted line in FIG. 6A illustrates values of the loss elastic modulus G" of the resin particle A at the time when the temperature is varied. Although detailed physical properties of the resin particle A will be described later, the resin particle A has a low storage elastic modulus G' of 0.4 Pa at 200° C., and has a state of such a high viscosity that a loss elastic modulus G" is 10 Pa at 200° C.

In the measurement of the modulus of elasticity, firstly, the resin particles were set in a pellet molding die having a diameter of 20 mm, a load of 15 ton was applied thereto by a pressurizer, the amount of the resin particles was adjusted so that a thickness of the pellet after pressurization became 1 mm, and the pellet was prepared. Next, the prepared pellet (diameter of 20 mm and thickness of 1 mm) is fixed between a lower plate and an upper plate of a rotational viscoelasticity measuring apparatus AR-G2 (manufactured by TA Instruments com.). A shearing stress of 10 Pa was applied from the upper plate in a cycle of 1 Hz, and the storage elastic modulus G' and the loss elastic modulus G" were calculated from phase differences with a shearing stress which is a response at that time. The above measurement was performed between 70° C. and 200° C. while the temperature between the plates was varied at a velocity of 2° C./min.

First, referring to the storage elastic modulus G' illustrated by the solid line in FIG. 6A, the storage elastic modulus G' rapidly decreases as the temperature increases, falls below 14 Pa at 130° C., and reaches 0.4 Pa at 200° C. When the storage elastic modulus G' is 14 Pa or lower, the ink is allowed to rapidly permeate into the inside of the porous substrate S1 due to the capillary phenomenon caused by the porous substrate S1 as previously described. In this example, the resin particles permeated into the porous substrate at 130° C. or higher, at which the storage elastic modulus G' became 14 Pa or lower. Accordingly, it is necessary to control the temperature in the heating process to at least 130° C. or higher.

On the other hand, the loss elastic modulus G" illustrated by the dotted line in FIG. 6A also decreases as the temperature increases, but maintains such a state that the viscosity is as high as approximately 10 Pa, even at 200° C. The blur can be sufficiently suppressed as long as the loss elastic modulus G" is 10 Pa or higher, and accordingly, the temperature in the heating process is preferably 200° C. or lower from the viewpoint of the loss elastic modulus G".

In other words, in the case of the resin particle A, the heating temperature at which the resin particle A can rapidly permeate into the porous substrate without causing the blur is 130° C. or higher and 200° C. or lower.

EXAMPLES (Examples 1 and 2, and Comparative Example 1)

The channel pattern illustrated in FIG. 4A was formed on the previously described porous substrate S1-2, with the use of the apparatus illustrated in FIG. 1 and FIG. 2 and the previously described resin particle A.

In Table 2, there are shown a result in the case where the heating temperature in the heating process was 200° C. (Example 1), a result in the case of 130° C. (Example 2), and a result in the case of 120° C. (Comparative Example 1). At a heating temperature of 120° C., the storage elastic modulus G' was 32 Pa, and the permeation into the porous substrate S1-2 was insufficient.

Note that in the resin particle A containing the COC, tan δ (=G"/G') which is the ratio of the storage elastic modulus G' to the loss elastic modulus G" at 200° C. is about 26, but this value is considerably large as compared with about 0.1 to 1.0 which is tan δ of many resin materials. Due to this property, the resin particles A maintained viscosity due to the high loss elastic modulus G", while permeating into the porous substrate S1-2 due to the low storage elastic modulus G', and could form a channel without causing a blur. In other words, the resin particles using the COC allowed the channel pattern formed on the porous substrate to permeate into the inside of the porous substrate S1-2 with high accuracy, and could form the channel wall. As a result, a channel corresponding to the channel pattern was formed with high accuracy.

Comparative Example 2

Figure 6B:
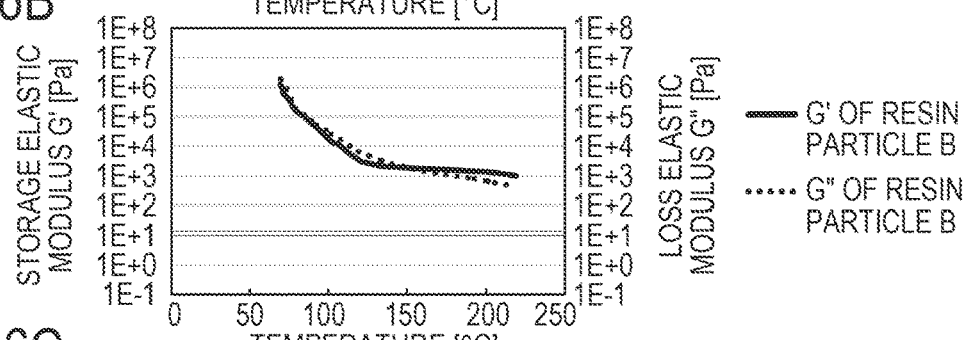
FIG. 6B is a temperature-dependent graph of a storage elastic modulus G' and a loss elastic modulus G" of a resin particle B.

As Comparative Example 2, a case where resin particle B having viscoelasticity illustrated in FIG. 6B was used would be described below. The resin particles B are particles obtained by externally adding silica particles to particles that are not formed of COC but formed of a copolymer of styrene and butyl acrylate, and have a volume average particle size of 6 μm, in the same manner as in the case of the resin particles A. As is illustrated in FIG. 6B, the storage elastic modulus G' and the loss elastic modulus G" of the resin particle B tend to decrease as the temperature increases, but both the moduli stop decreasing in between $1 \times 10^2$ Pa and $1 \times 10^3$ Pa. Because of this, a temperature region in which the storage elastic modulus G' is 14 Pa or lower does not exist in the resin particle B.

The resin particles B were actually placed on the porous substrate and subjected to the heating process at a heating temperature of 200° C.; but the resin particles B melted and spread only on the surface of the porous substrate, and such an appearance was not observed that the resin particles B permeated into the inside of the porous substrate S1.

Comparative Example 3

Figure 6C:
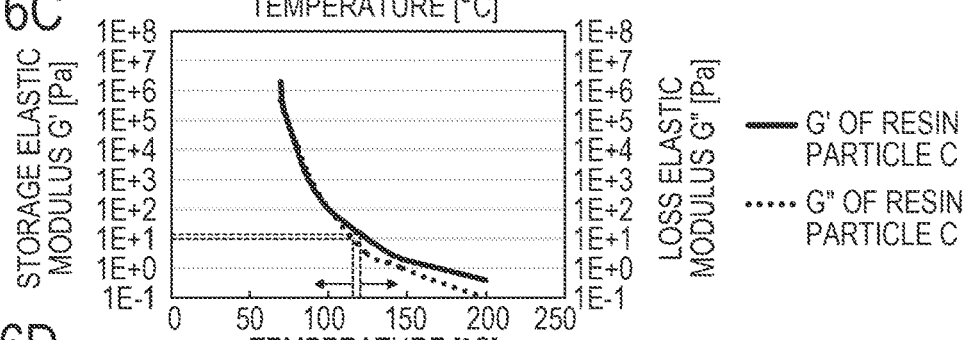
FIG. 6C is a temperature-dependent graph of a storage elastic modulus G' and a loss elastic modulus G" of a resin particle C.

In addition, as Comparative Example 3, the case will be described in which a resin particle C having viscoelasticity illustrated in FIG. 6C are used. In the resin particle C, the storage elastic modulus G' is 0.4 Pa, and the loss elastic modulus G" is 0.1 Pa, at 200° C.; and the storage elastic modulus G' is 12 Pa, and the loss elastic modulus G" is 5 Pa, at 125° C. In other words, the resin particles C are resin particles in which both the storage elastic modulus G' and the loss elastic modulus G" are low, and a temperature region does not exist in which the storage elastic modulus G' is 14 Pa or lower and the loss elastic modulus G" is 10 Pa or higher. Because of this, when the channel wall was formed with the use of the resin particles C, the resin particles C rapidly permeated into the porous substrate by heating at a heating temperature of 125° C.; but, when the resin particles C permeated into the porous substrate, the permeation proceeded concentratedly on a portion where the resin particles C easily permeated, and thereby a blur occurred.

Example 3

A COC (8007F-600 grade produced by Polyplastics Co., Ltd.) was used in place of the COC (TM grade produced by Polyplastics Co., Ltd.) which was used in the resin particle A. Furthermore, 50 parts by mass of a plastic component (Paraffin Wax HNP-51 (Nippon Seiro Co., Ltd.)) with respect to 100 parts by mass of the COC were kneaded, and a kneaded resin was obtained. A resin particle D was obtained by being produced in the same manner as in the case of the resin particle A, except that the kneaded resin was used.

In the case of the COC (8007F-600 grade produced by Polyplastics Co., Ltd.) alone, a temperature region in which the storage elastic modulus G' becomes 14 Pa or lower does not exist up to 300° C., but when the COC is mixed with paraffin wax of the plastic component, a temperature region becomes to exist, in which the storage elastic modulus G' becomes 14 Pa or lower. Specifically, the resin particle D had the viscoelasticity illustrated in FIG. 6E. In this case, the resin particle D showed a state in which the storage elastic modulus G' satisfied 14 Pa or lower, and the loss elastic modulus G" satisfied 10 Pa or higher, in a range of 195° C. to 300° C.

In general, materials having similar solubility parameters (hereinafter referred to as SP value) have high affinity and are well mixed with each other. The viscoelasticity can be suitably controlled by use of such a plastic component that the difference in the SP value with respect to COC is 3.5 or smaller. The SP value can be determined by the Fedors method. For information, in the combination in the present Example, the difference between the SP values is 1.56.

The channel wall was formed in the same manner as in Example 1 with the use of the resin particle D at a heating temperature of 200° C. in the heating process, and as a result, a channel corresponding to the channel pattern could be formed with high accuracy.

In addition, when the COC and the plastic component are used in combination, the channel wall becomes to exhibit characteristics of resisting cracking. Because of this, the channel wall which is formed with the use of the resin particle D resists cracking, even when having been deformed. As a COC to be used in combination with a plastic component, the COC that softens at a relatively high temperature is used as compared with a case where a COC is used alone. Such a COC generally has a large deformation rate (elongation rate at break) before rupture occurs, and accordingly, it is considered that a channel wall formed with the use of the combination of the COC and a plastic component resists causing a crack. Examples of a usable plastic component include: waxes such as a hydrocarbon wax, an ester wax and an alcohol wax; crystalline resins such as crystalline polyester; and silicone oil.

<Durability Evaluation>

Durability of a microchannel device was evaluated by focusing on crack resistance.

The channel pattern prepared in Example 3 was wound around a metallic cylinder having a predetermined diameter, then both ends were pulled with a force of 4.9 N, and it was observed whether cracking (crack) occurred in the channel pattern. The diameter of the cylinder was gradually reduced, and the evaluation was repeated until cracking was observed in the channel pattern.

In the microchannel device which was prepared with the use of the resin particle D and had a thickness of 0.08 mm, cracking was not observed until the microchannel device was wound on a cylinder having a diameter of 4 mm, and cracking was observed for the first time, when the microchannel device was wound around a cylinder having a diameter of 3 mm. In addition, in the microchannel device of Example 1 that was produced with the use of the resin particle A, cracking was observed when the microchannel device was wound around a cylinder having a diameter of 12 mm. For information, an elongation rate at break of the COC used in the resin particle A is 1.3, and an elongation rate at break of the COC used in the resin particles D is 4.5.

The results of Examples 1 to 3 and Comparative Examples 1 to 3 are shown in Table 2.

The resin particle A had a low storage elastic modulus G' and a high loss elastic modulus G" at a heating temperature of 200° C. or 130° C., and the resin particle D had a low storage elastic modulus G' and a high loss elastic modulus G" at a heating temperature of 200° C.; and accordingly, the resin particles could rapidly permeate into the porous substrate without causing a blur. The resin particles B did not permeate into the porous substrate at a heating temperature of 200° C., because the storage elastic modulus G' was high. The resin particle C had a low storage elastic modulus G' at a heating temperature of 125° C., and rapidly permeated into the porous substrate, but the loss elastic modulus G" was also low, and accordingly a blur occurred at the time of permeation.

TABLE 2

| | | Heating temperature when channel is formed (° C.) | Storage elastic modulus G' at heating temperature (Pa) | Loss elastic modulus G" at heating temperature (Pa) | Permeation into porous substrate | Blur at the time of permeation |
|---|---|---|---|---|---|---|
| Example 1 | Resin particle A | 200 | 0.4 | 10 | Fully permeated | None |
| Example 2 | Resin particle A | 130 | 14 | 240 | Fully permeated | None |
| Example 3 | Resin particle D | 200 | 9.98 | 116 | Fully permeated | None |
| Comparative example 1 | Resin particle A | 120 | 32 | 640 | Insufficient permeation | — |
| Comparative example 2 | Resin particle B | 200 | 1342 | 670 | No permeation | — |
| Comparative example 3 | Resin particle C | 125 | 12 | 5 | Fully permeated | Occurred |

In summary, it is necessary to heat and melt the resin particles under a temperature condition in which the storage elastic modulus G' becomes 14 Pa or lower and the loss elastic modulus G" becomes 10 Pa or higher, as the viscoelasticity of the resin particle, and to allow the resin particles to permeate into the porous substrate; and in this case, a channel corresponding to the channel pattern could be formed with high accuracy.

Note that in the present Example, COC was used as a resin which satisfied the storage elastic modulus G' of 14 Pa or lower and the loss elastic modulus G" of 10 Pa or higher, but that another known material may be used as long as the material satisfies the storage elastic modulus G' and the loss elastic modulus G".

Figure 6D:
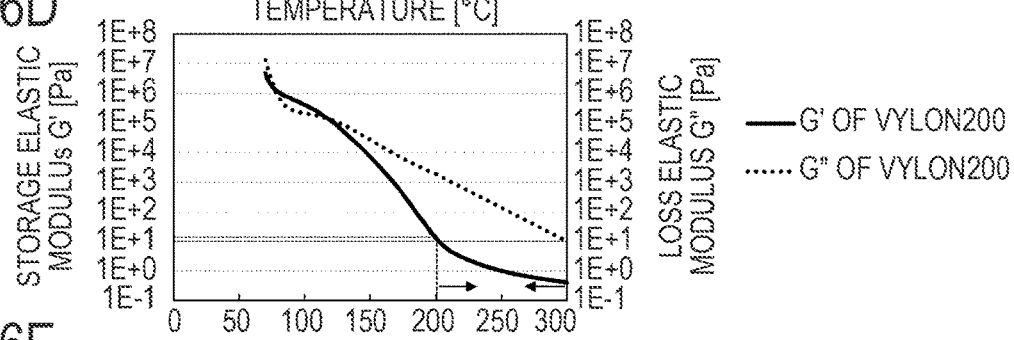
FIG. 6D is a temperature-dependent graph of a storage elastic modulus G' and a loss elastic modulus G" of a resin particle using VYLON200 (registered trademark).
Figure 6E:
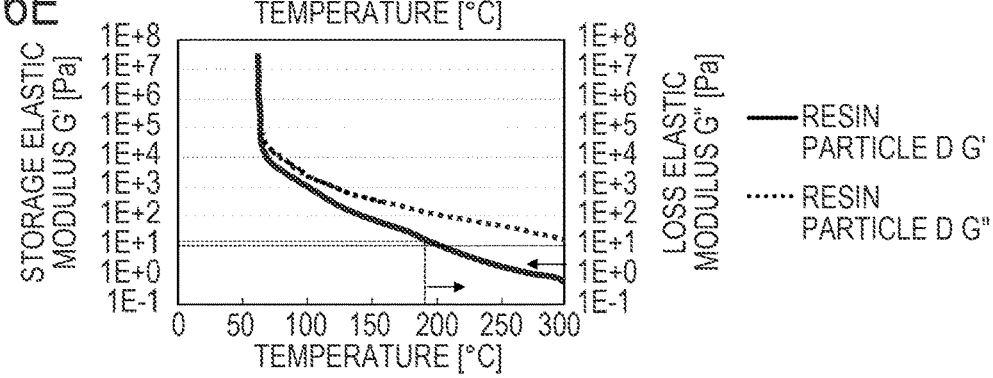
FIG. 6E is a temperature-dependent graph of a storage elastic modulus G' and a loss elastic modulus G" of a resin particle D.

For example, when VYLON (registered trademark) 200 (produced by Toyobo Co., Ltd.) which is a polyester-based resin was used in place of the COC, the resin particle was obtained which had viscoelasticity illustrated in FIG. 6D. In this case, the resin particle shows a state in which the storage elastic modulus G' satisfied 14 Pa or lower, and the loss elastic modulus G" satisfied 10 Pa or higher, in a range of 210° C. to 300° C. The resin particle was transferred onto the porous substrate S1 by the channel pattern forming unit 100, and the resultant resin particle was heated in an oven set at 230° C. for 2 minutes; and as a result, the resin particles could permeate into the porous substrate S1 without causing the blur.

As described above, a channel pattern can be formed even with such a high-viscosity material as to resist being ejected in an inkjet method, by use of the electrophotographic method, and the degree of freedom in material selection becomes high. Thereby, it is enabled for a channel pattern to be formed with the use of a high-viscosity resin particle having such melting characteristics that the resin particle rapidly permeates into the inside of the substrate in a heating portion. In addition, because of the electrophotographic method, the channel pattern can be formed on demand with high productivity, at low cost, and with high accuracy.

In addition, a channel corresponding to a channel pattern can be formed with high accuracy without causing the blur, by heating at a temperature at which the storage elastic modulus G' of a resin particle is low (14 Pa or lower) enough to permeate into the porous substrate S1 and the loss elastic modulus G" is high (10 Pa or higher). As long as the micro channel is formed under this condition, the formation of the channel pattern is not limited to the electrophotographic method.

Example 4

Figure 7:
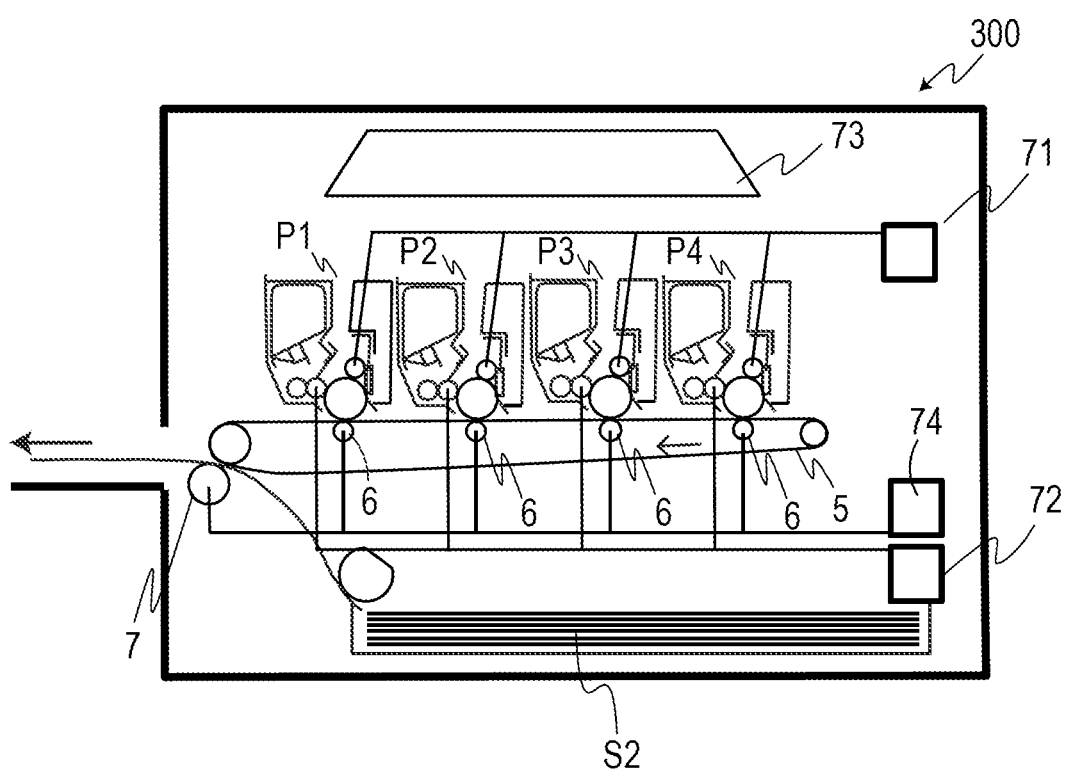
FIG. 7 is a schematic diagram of a channel pattern forming unit 300 in Example 4.

Such a case will be described below that an apparatus having a plurality of channel pattern forming units as illustrated in FIG. 7 is used.

Regarding a channel pattern forming unit 300 according to the present Example, only the difference from the channel pattern forming unit of Example 1 will be described; and the same members will be designated by the same reference numerals, and the description of the same portions will be omitted. In Example 1, a filter paper having a thickness of 80 μm was used as the porous substrate, but such a case is conceivable that a porous substrate having different physical properties is required depending on the application. For example, in the case where a porous substrate having a high void ratio or a thicker porous substrate is used, more toner becomes necessary for filling the voids. In other words, it is necessary to form a thicker image of the resin particles on the porous substrate.

As a method for forming a thicker image of the resin particles A on a porous substrate, by the channel pattern forming unit described in Example 1, there are considered a method of increasing the roughness of the surface of the developing roller 23, and a method of changing a contact state (position or pressure) between the developing roller 23 and the developing blade 25. Thereby, the amount of the resin particles A to be conveyed by the developing roller 23 increases, and as a result, a thickness of the image of the resin particles A also increases, which is formed on the porous substrate.

In addition, by increasing a peripheral speed ratio of the developing roller 23 to the photosensitive drum 11; and thereby, the amount of the resin particles A developed on the photosensitive drum 11 can be increased without changing the amount of the resin particles A on the developing roller 23, and the thickness of the image of the resin particles A can be increased which is formed on the porous substrate.

However, by these methods alone, it is difficult to continuously form a stable channel pattern while increasing the thickness of the image of the resin particles A up to several times, which is formed on the porous substrate. This is because if the amount of the resin particles A is increased too much, which are conveyed by the developing roller 23, so-called fogging tends to easily occur in which insufficiently charged resin particles attach to portions that should be channel wall portions originally. In addition, when the peripheral speed ratio is excessively increased, streaky development unevenness (so-called banding) which originates in the driving velocity unevenness tends to easily occur in the formed channel pattern.

Then, an apparatus shall be used which has a plurality of channel pattern forming units, and thereby, an image of the resin particles A having a thickness of several times compared to an apparatus having only one channel pattern forming unit can be stably formed on the porous substrate. Note that because the channel pattern is formed by the electrophotographic method which uses the resin particle, a thick material layer can be stably formed on the porous substrate. In the case of an inkjet or thermal transfer method that forms an image with the use of a relatively low-viscosity material, there is a possibility that if a large amount of material is placed on a porous substrate, the material spreads and causes a blur, because the viscosity is low. In addition, such a method is also conceivable as to supply a small amount of material to the porous substrate repeatedly while providing time intervals, but the method leads to a significant decrease in productivity.

<Channel Pattern Forming Unit>

A configuration of the whole channel pattern forming unit will be described below with reference to FIG. 7. FIG. 7 is a cross-sectional view illustrating a schematic configuration of a channel pattern forming unit 300 according to Example of the present disclosure, and illustrates each configuration briefly.

In the channel pattern forming unit 300, four process cartridges P (P1, P2, P3 and P4) are horizontally arranged which are a first process cartridge P1, a second process cartridge P2, a third process cartridge P3, and a fourth process cartridge P4. Each process cartridge can be independently maintained, which provides satisfactory convenience. For information, each of the process cartridges P1, P2, P3 and P4 has the equal configuration to that of the process cartridge P illustrated in FIG. 1.

<Channel Pattern Forming Process>

The operation of the process cartridge in the channel pattern formation is similar to that in the channel pattern forming unit in Example 1. The developer image developed on the photosensitive drum 11 is primarily transferred, by a potential difference from that of a primary transfer roller 6, to an intermediate transfer member 5 in contact with the roller. The primary transfer roller 6 is connected to a transfer high-voltage power source 74, and +300V is applied to the primary transfer roller 6, by the division from a voltage to be applied to a secondary transfer roller 7 which will be described later. This process is sequentially performed for the process cartridge P1, the process cartridge P2, the process cartridge P3, and the process cartridge P4, and all the developer images are superimposed on the intermediate transfer member 5. The superimposed developer image is transferred onto a porous substrate S2 of a recording medium at a secondary transfer portion where the intermediate transfer member 5 and the secondary transfer roller 7 are arranged close to each other, by a potential difference from that of the secondary transfer roller 7 to which +2000V is applied by the transfer high-voltage power source 74. As the secondary transfer roller 7, the member is used which is similar to that of the transfer roller 4 in FIG. 1.

The porous substrate S2 onto which the developer image has been transferred is discharged to the outside of the channel pattern forming unit 300, in such a state that the developer image remains on the upper side in the direction of gravity. In addition, the developer that has not been transferred, on the photosensitive drum 11 which has passed the intermediate transfer member 5, is scraped off by the cleaning member 14 in contact with the photosensitive drum 11; and the process beginning from the charging by the charging roller 12 is repeated again, and thereby the image is continuously formed.

The channel pattern forming unit 300 mainly has four developing modes (printing modes) according to a substantial void ratio and thickness of the porous substrate to be used.

The developing mode 1 is a mode of forming an image of the resin particles A onto the porous substrate S2, with the use of the resin particles A only in the process cartridge P1. In other words, in the channel pattern forming process, the process cartridge P1 irradiates the photosensitive drum 11 with the laser beam 9 to develop the resin particles A; but the process cartridges P2, P3 and P4 do not irradiate the photosensitive drum 11 with the laser beam 9, and do not develop the resin particles A. In the developing mode 1, similarly to a channel pattern forming unit 100 illustrated in FIGS. 11A and 11B, an image of the resin particles A having 1.25 mg/cm² per unit area can be formed on the surface of the porous substrate S2.

The developing mode 2 is a mode of forming an image of the resin particles A onto the porous substrate S2, with the use of the resin particles A in the process cartridges P1 and P2. In other words, in the channel pattern forming process, the process cartridge P1 and P2 are irradiated with the laser beam 9, but the process cartridges P3 and P4 are not irradiated with the laser beam 9. Thereby, an image of the resin particles A having 2.5 mg/cm² per unit area can be formed on the surface of the porous substrate S2.

The developing mode 3 is a mode of forming an image of the resin particles A onto the porous substrate S2, with the use of the resin particles A in the process cartridges P1, P2 and P3. In other words, in the channel pattern forming process, the process cartridge P1, P2 and P3 are irradiated with the laser beam 9, but the process cartridges P4 is not irradiated with the laser beam 9. Thereby, an image of the resin particles A having 3.75 mg/cm' per unit area can be formed on the surface of the porous substrate S2.

In the developing mode 4, an image of the resin particles A is formed on the porous substrate S2, with the use of the resin particles A in all the process cartridges P1, P2, P3 and P4. In other words, in the channel pattern forming process, all of the process cartridges P1, P2, P3 and P4 are irradiated with the laser beam 9. Thereby, an image of the resin particles A having 5.0 mg/cm² per unit area can be formed on the surface of the porous substrate S2.

<Selection of Developing Mode>

The channel pattern forming unit 300 has the previously described plurality of developing modes, and accordingly, the user can select the developing mode from, for example, a personal computer of a host apparatus, according to the condition of the porous substrate S2 to be printed. Which developing mode is appropriate is determined by the thickness of the porous substrate S2 and the substantial void ratio. If the amount of the resin particles to be placed is small with respect to the voids in the porous substrate S2, the voids in the porous substrate S2 cannot be completely filled, and leakage occurs in the channel of the microchannel device. In addition, when the amount of the resin particles to be placed is too large with respect to the voids of the porous substrate S2, there is a possibility that an excess of resin particles with respect the amount completely filling the voids diffuses into the pores beyond the range of the channel pattern and narrows the channel. For this reason, it is acceptable to select a developing mode in which the amount of resin particles fills at least the voids in the porous substrate S2 completely, and becomes as close as possible to the amount for filling the voids completely.

As an example of the developing mode selection, a case shall be considered in which a filter paper is used of which only the thickness is different from that of the porous substrate shown in Example. When a porous substrate S2 is used of which the thickness is 80 μm, suppose that 1.0 mg/cm² or more of resin particles is necessary on the porous substrate S2; and the maximum thickness of the filter paper in which a satisfactory channel can be formed by the amount of resin particles per unit area can be calculated in the following way. Specifically, the maximum thickness of the filter paper for each developing mode which can form a satisfactory channel=80 (μm)×amount of resin particles (mg/cm²)/1.0 (mg/cm²) on surface of porous substrate for each developing mode. In Table 3, maximum values of the thickness of the filter paper are shown on which a satisfactory channel can be formed without causing leakage in each developing mode.

TABLE 3

|  | Developing mode 1 | Developing mode 2 | Developing mode 3 | Developing mode 4 |
|---|---|---|---|---|
| Maximum thickness of filter paper | 100 μm | 200 μm | 300 μm | 400 μm |

Based on this condition, it is acceptable from Table 3 to select filter paper having a thickness of 100 μm or smaller: developing mode 1, filter paper having a thickness of 100 μm to 200 μm: developing mode 2, filter paper having a thickness of 200 μm to 300 μm: developing mode 3, and filter paper having a thickness of 300 μm to 400 μm: developing mode 4.

A combination of the developing mode and the thickness of the filter paper has been shown as an example, but a necessary amount of resin particles also changes according to the void ratio of the filter paper, and accordingly, the developing mode is changed according to the void ratio of the filter paper.

<Double-Sided Printing>

Note that in the above description, the maximum thickness of the filter paper was shown in a method of placing the resin particles on one surface of the porous substrate and allowing the resin particles to permeate into the pores by heating; but satisfactory channels free from leakage can be formed by double-sided printing even in a thicker porous substrate.

As an example of double-sided printing, a method of double-sided printing images on the porous substrate S2 having a thickness of 600 μm, which is different from the porous substrate S2 only in terms of thickness, will be described below with reference to FIGS. 8A to 8D.

FIGS. 8A to 8D illustrate a cross-sectional view of a portion on which the resin particles T are placed, in each process in the double-sided printing. For information, hereinafter, the resin particle A is used as the resin particle T, the surface on which the resin particle T is placed firstly is referred to as a front side of the porous substrate S2, and the surface on which the resin particle T is placed later is referred to as a back side of the porous substrate S2.

Figure 8A:
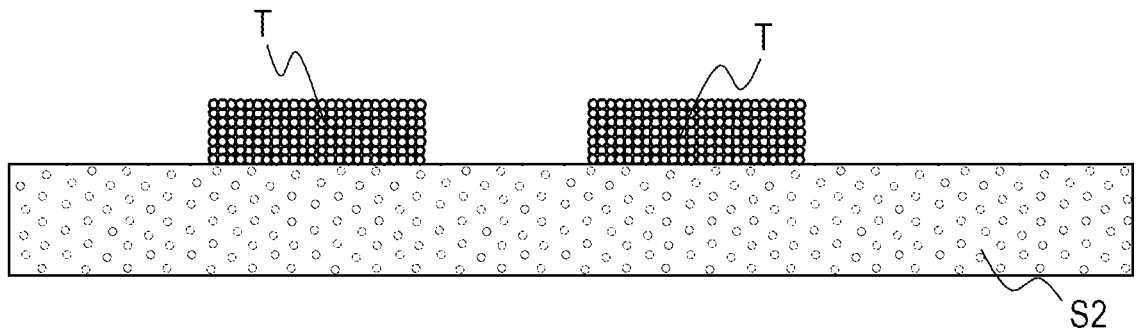
FIGS. 8A, 8B, 8C, and 8D are explanatory diagrams illustrating the channel formation in Example 4.

Firstly, the double-sided printing by the developing mode 3 was selected from Table 3, because the thickness of the porous substrate S2 was 600 μm. In FIG. 8A, a state is illustrated in which the channel pattern forming process by the developing mode 3 has been performed. At this time, the resin particles T are merely attached onto the front side of the porous substrate S2.

Figure 8B:
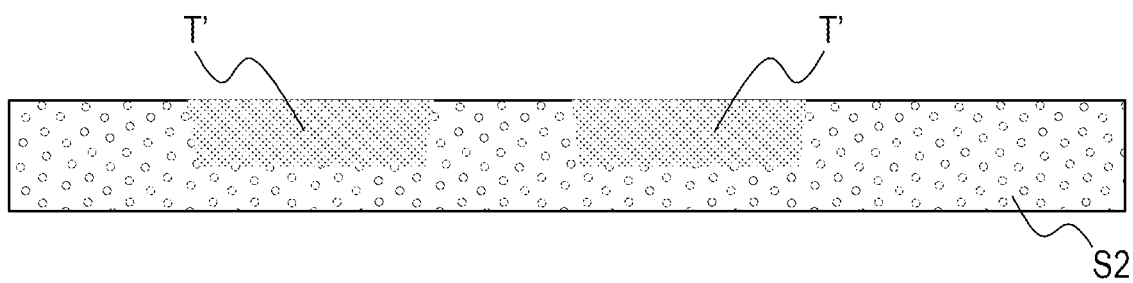

Next, a state after the heating process is illustrated in FIG. 8B. The resin particles T that attach to the front side of the porous substrate S2 melt by heating and become a state of resin particles T' that permeate into the inside of the porous substrate S2. However, at this time, because the amount of the resin particles T is small with respect to the thickness of the porous substrate S2, the permeated resin T' does not reach the back side of the porous substrate S2, and a channel surrounded by the permeated resin T' cannot be formed.

Figure 8C:
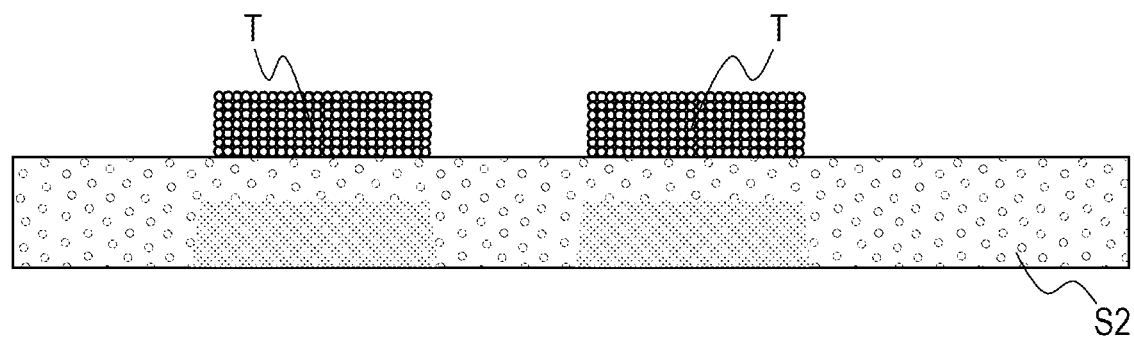

Then, the porous substrate S2 is reversed and the channel pattern forming process in the developing mode 3 is performed again. The resultant state is illustrated in FIG. 8C. In the second development, the resin particles T are placed on the back side of the resin T' that has previously permeated into the front side.

Figure 8D:
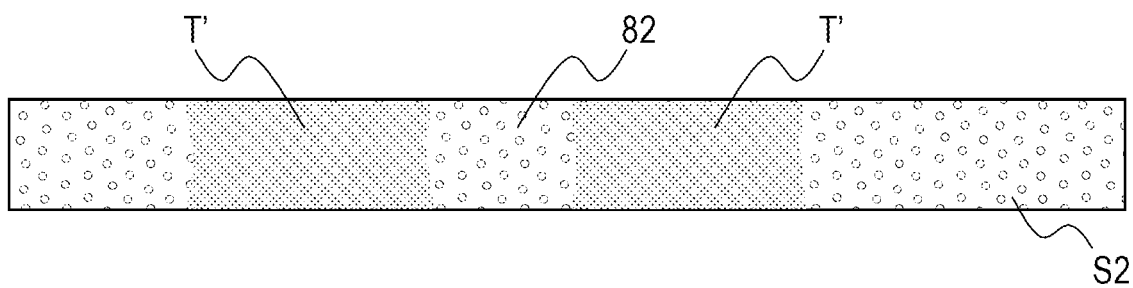

After that, the heating process is performed again. The resultant state is illustrated in FIG. 8D. By passing through the heating process again, the resin particles T melt, and the resultant resin permeates also from the back side of the porous substrate S2, and is connected to the resin T' that has already permeated from the front side; and thereby the channel 82 is formed that is surrounded by the permeated resin T'.

As described above, even in a thick porous substrate S2 in which it is difficult that a satisfactory channel free from leakage is formed by printing only on the front surface, a satisfactory channel 82 free from the leakage can be formed due to the permeated particles T', by allowing the melted resin of the resin particles T to permeate from both the front and back sides of the paper. Specifically, in the configuration of the present Example, the satisfactory channel 82 free from leakage can be formed on a porous substrate up to 800 μm which is twice as thick as that in the developing mode 4. In addition, a channel can be formed even in the porous substrate S2 having a higher void ratio and a larger thickness, by use of a channel pattern forming unit that has five or more process cartridges P.

<Fine Adjustment of Amount of Resin Particles>

Note that in the present Example, the amount of the resin particles T to be placed on the porous substrate S2 in each developing mode is a discrete value, but that such an amount of the resin particles T can also be placed as to be a value between those of the developing modes. For example, the amount of the resin particles T to be placed on the porous substrate S2 may be adjusted by the developing peripheral speed ratio, because the amount of the resin particles T to be developed in each process cartridge P changes with the change of the developing peripheral speed ratio. In addition, it is also acceptable to adjust the amount of the resin particles T to be placed on the porous substrate S2 by the intensity of the laser beam 9, because a ratio of the resin particles T to be developed from the developing roller 23 to the photosensitive drum 11 (so-called developing efficiency) can be reduced by diminishing the intensity of the laser beam 9. An excess of resin particles T with respect to the amount can be reduced with which voids of the porous substrate S2 are completely filled, by the optimization of the amount of the resin particles T to be placed on the porous substrate S2, and accordingly a microchannel device with higher accuracy can be prepared.

<Summary>

As described above, by appropriately selecting the developing mode, single-sided printing/double-sided printing, and developing peripheral speed ratio/laser light intensity, an image of resin particles, of which the thickness is appropriately adjusted so as to correspond to various types of porous substrate, can be stably and easily formed on the porous substrate S2. The above description is achieved by the use of the electrophotographic method that can easily and accurately adjust the amount of the resin particles T to be placed on the porous substrate, in a wide range.

Example 5

In Example 5, a microchannel device is produced that is provided with a protection layer 86 which covers one surface side of the formed channel 82. Due to the protection layer 86 being provided, the channel 82 can become a closed system, drying of the inspection liquid can be prevented, attachment of the inspection liquid to the hand can be prevented, and safety is enhanced.

In the present Example, the same material was used for a material for forming the channel wall 81 and a material for forming the protection layer 86. In this case, the adhesiveness between the channel wall 81 and the protection layer 86 is enhanced, and the channel device has a high degree of sealing. When a microchannel device having the channel wall 81 and the protection layer 86 is formed of the same material, processes of forming the protection layer 86 and the channel wall 81 are separately performed.

In the present Example, a porous substrate S1-2 was used in which a polyethylene terephthalate (PET) film (trade name: Lumirror™ S10, produced by Toray Industries, Inc., 50 μm thick) was bonded to one surface as a cover film 101. Due to the cover film 101 being bonded, drying, contamination and the like on the bonded side can be suppressed. An average thickness of the cover film 101 is preferably 0. 01 mm or larger and 0. 5 mm or smaller, from the viewpoint of coexistence of both strength and flexibility.

A material of the cover film 101 is not particularly limited and may be appropriately selected according to the purpose. Examples thereof include: polyester such as polyethylene terephthalate (PET) and polyethylene naphthalate (PEN); and polycarbonate, polyimide resin (PI), polyamide, polyethylene, polypropylene, polyvinyl chloride, polyvinylidene chloride, polystyrene, a styrene-acrylonitrile copolymer, and cellulose acetate. These materials may be used singly, or in combination of two or more. Among these materials, polyethylene terephthalate (PET) and polyethylene naphthalate (PEN) are particularly preferable.

Figure 9A:
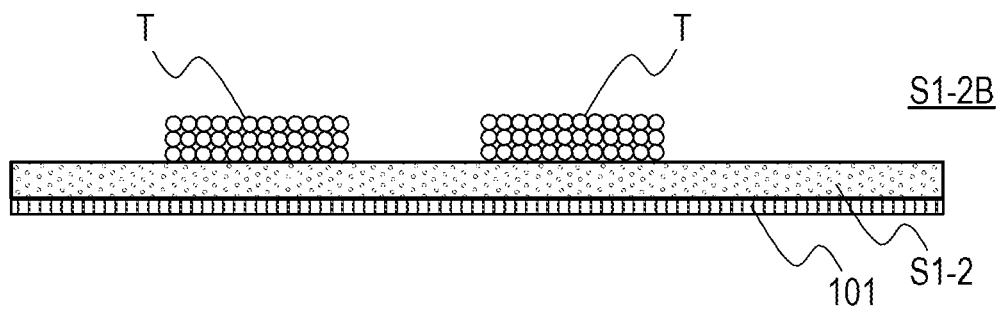
FIGS. 9A, 9B, 9C, and 9D are explanatory diagrams illustrating the channel formation in Example 5.
Figure 9B:
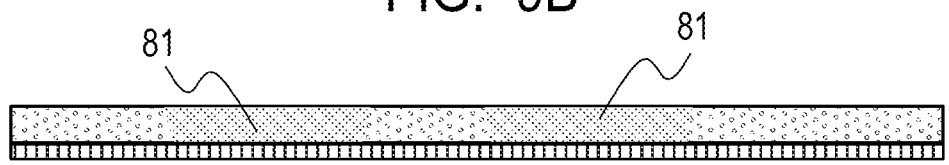

Firstly, as the first channel pattern forming process, the resin particles T were placed on the surface of the porous substrate S1-2, to which the cover film 101 formed from PET was not bonded, in the same manner as in Example 1 so as to form the channel pattern of FIG. 4A (FIG. 9A). After that, as a first heating process, the resin particles T were melted, was allowed to permeate into the porous substrate S1-2, and formed the channel wall 81 (FIG. 9B). Note that in the present Example, the resin particle A was used as the resin particle T.

Figure 9C:
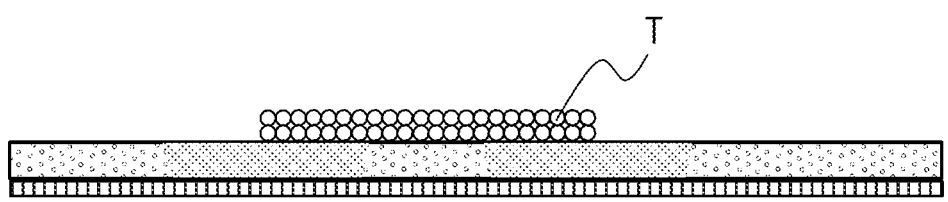
Figure 9D:
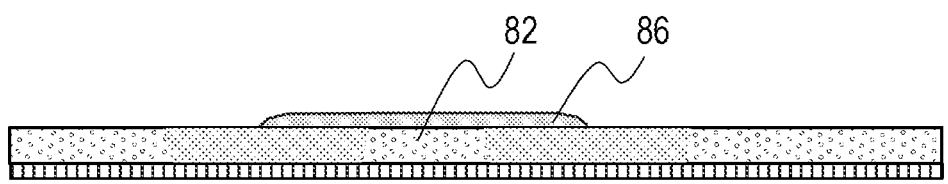

Next, as a second channel pattern forming process, the resin particles T were placed on a position which covers the channel 82 in FIG. 4A (FIG. 9C). At this time, the resin particles T were placed on the channel walls 81 on both sides of the channel so as to overlap each other by 2.25 mm. Next, as a second heating process, heating was performed at 120° C. for 2 minutes. At this temperature, the resin particles T placed on the surface of the porous substrate melt on the surface, but do not permeate into the inside of the porous substrate S1-2, and accordingly, the channel 82 formed in the inside of the porous substrate S1-2 is maintained. As a result, the protection layer 86 is formed so as to cover the channel 82 (FIG. 9D).

In the present Example, the cover film 101 was bonded to one surface of the porous substrate S1-2, but it is acceptable to form the protection layers 86 with the use of the resin particle T in place of the cover film 101, and form a microchannel device that has the protection layers 86 on both surfaces of the porous substrate S1-2. In this case, the resin particle T to be used is not limited to the resin particle A, and may be a resin particle formed from a COC.

In addition, in the present Example, the same resins were used for the resin that formed the channel wall 81 and the resin that formed the protection layer 86, but different resins may be used. When different resins are used, it is preferable to use a hydrophobic resin in order to prevent the influence of water.

For comparison, the protection layer 86 was formed by changing the heating temperature in the second heating process to 130° C., but as a result, the resin particles T permeated and blocked the channel 82. In addition, when the protection layer 86 was formed by adjusting the temperature to a temperature at which the storage elastic modulus G' became 20 Pa, and as a result, the permeation of the resin particles T did not occur; and a satisfactory protection layer 86 was formed.

From the above results, the heating temperature in the second heating process for forming the protection layer 86 is required to be a temperature or lower at which the storage elastic modulus G' can be kept so that the resin particles T do not permeate into the porous substrate S1-2 (14 Pa or higher and preferably 20 Pa or higher), and to be a temperature (softening temperature) or higher at which the resin particles T melt to such an extent as to form the protection layer 86.

Example 6

In Example 5, the protection layer 86 was formed which covered the channel 82 on the surface of the porous substrate S1-2, but, the protection layer 86 can also be formed on the surface side of the channel 82 in the inside of the porous substrate S1-2. In the present Example, such a microchannel device is produced.

Figure 10A:
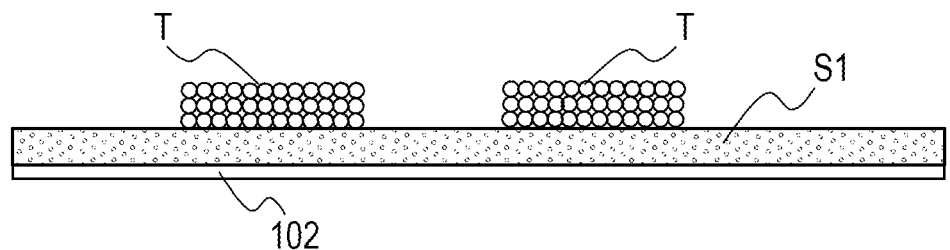
FIGS. 10A, 10B, 10C, and 10D are explanatory diagrams illustrating the channel formation in Example 6.
Figure 10B:
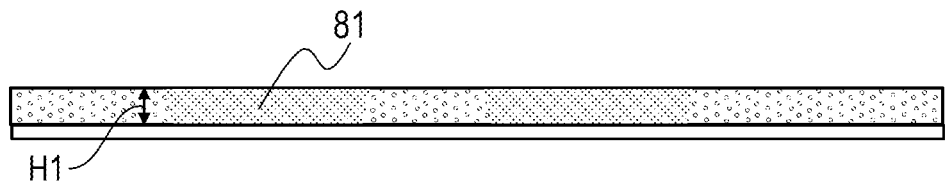

Firstly, in the same manner as in Example 1, as a first channel pattern forming process, the resin particles T were placed on the porous substrate S1 of which the thickness H1 was 0.08 mm, so as to form the channel pattern illustrated in FIG. 4A (FIG. 10A). For information, a backup material 102 may be provided on a surface of the porous substrate S1 opposite to the surface on which the resin particles T have been placed. Examples of the backup material 102 include a laminate. After that, as a first heating process, the resin particles T were melted, were allowed to permeate into the porous substrate S1, and formed the channel wall 81 (FIG. 10B). Note that in the present Example, the resin particle A was used as the resin particle T.

Figure 10C:
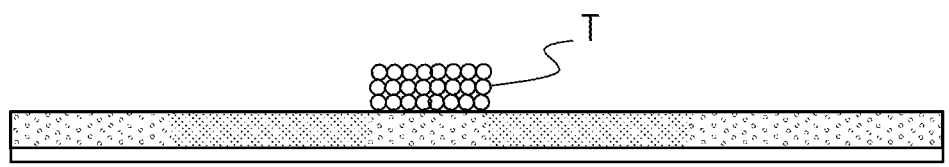
Figure 10D:
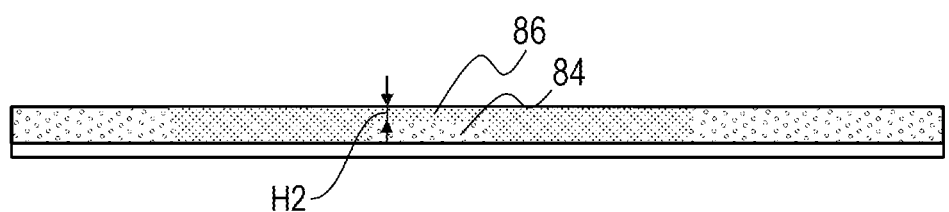

Next, as a second channel pattern forming process, the resin particles T were placed on a position which covers the channel 82 in FIG. 4A (FIG. 10C). Next, as a second heating process, heating was performed at 120° C. for 30 seconds. Sufficient permeation does not occur in this heating time, and accordingly, the protection layer 86 is formed on an upper portion of the channel (FIG. 10D). Under this condition, such a protection layer 86 can be formed that the height H2 of the permeated resin is about 0.04 mm, and accordingly, when the porous substrate S1 having the thickness H1 of 0.08 mm is used, a height of the channel 82 of about 0.04 mm can be ensured. The heating time can be appropriately adjusted so as to correspond to a material to be used and a thickness of the protection layer 86 to be formed.

Example 7

In Example 6, the protection layer 86 was formed by changing the heating time, but a similar protection layer 86 is formed by reducing the placement amount of the resin particles T which are placed on a position covering the channel 82, and thereby reducing the amount of resin T' that permeates. In the present Example, such a microchannel device is produced. In this production method, a plurality of materials are not used and the heating process is not performed twice; and accordingly, the protection layer can be briefly formed. Note that in the present Example, the resin particle A was used as the resin particle T.

Figure 11A:
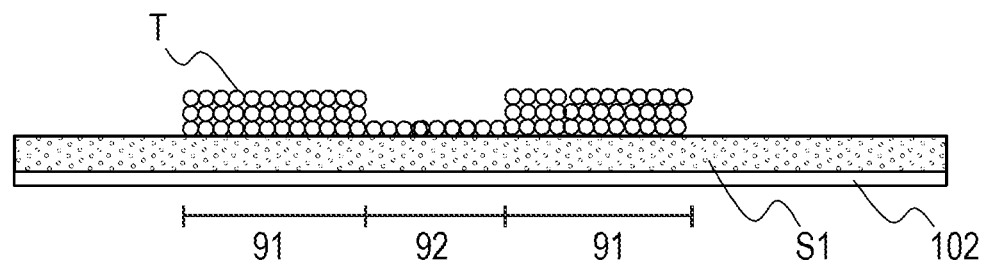
FIGS. 11A and 11B are explanatory diagrams illustrating the channel formation in Example 7.

In the present Example, when the channel pattern is formed in the channel pattern forming process, the resin particles T are allowed to exist in both of the region 91 that becomes the channel wall 81 and the region 92 that becomes the channel 82. At this time, the amount of the resin particles T in the region 92 that becomes the channel 82 is controlled to be smaller than the amount of the resin particles T in the region 91 that becomes the channel wall 81 (FIG. 11A). The placement amount is preferably about 25 to 75% by mass of the amount of the resin particles T which are used for a portion that forms the channel wall 81.

Figure 11B:
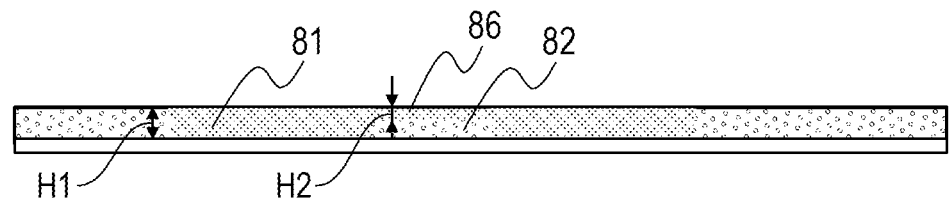

Subsequently, a heating process is performed. The heating conditions were set at 200° C. for 2 minutes, similarly to that in Example 1. Through the heating process, the resin particles T in the region 91 that becomes the channel wall 81 permeate and form the channel wall 81. On the other hand, the amount of the resin particles T in the region 92 is small that becomes the channel 82, and accordingly, remain in a state of having slightly permeated into the porous substrate S1 (FIG. 11B). A degree of permeation at this time becomes large as the storage elastic modulus G' at the heating temperature becomes low, and accordingly, it is required that the storage elastic modulus G' is not too low. The resin particles T were used that had a storage elastic modulus G' of 0.2 Pa at 200° C., and as a result, the height of the channel 82 became as low as 0.02 mm; and accordingly, it is preferable that the storage elastic modulus G' is 0.2 Pa or higher. It is more preferable that the storage elastic modulus G' is 0.4 Pa or higher. Note that the height of the channel 82 is such a value that the height H2 of the permeated resin is subtracted from the thickness H1 of the porous substrate S1, and is preferably 0.02 mm or larger.

Example 8

In Example 8, another Example is shown in which the protection layer 86 is provided so as to cover the channel 82. In Example 8, the channel pattern forming unit of FIG. 7 is used; the storage elastic modulus G' is controlled by changing the materials of the protection layer 86 and the channel wall 81, and using a first hydrophobic resin and a second hydrophobic resin; and the protection layer 86 is formed.

Figure 12A:
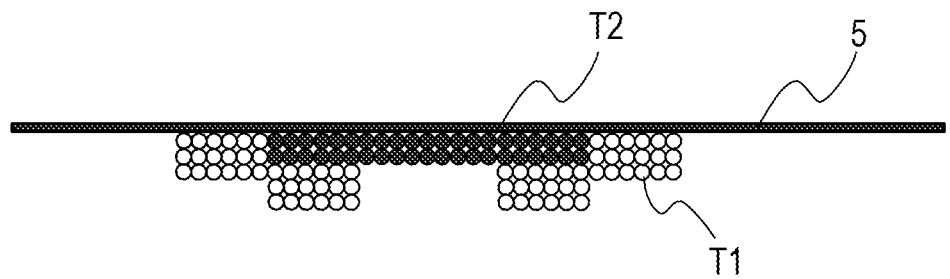
FIGS. 12A, 12B, and 12C are explanatory diagrams illustrating the channel formation in Example 8.
Figure 12B:
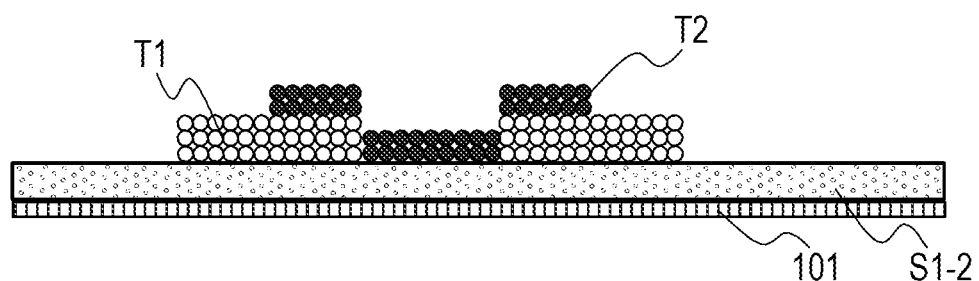

The channel pattern forming process illustrated in FIG. 7 is as described above; and in the present Example, particles of a COC (produced by Polyplastics Co., Ltd., 8007 grade) which is a second hydrophobic resin are charged into the process cartridge P1 as resin particles T2 for forming the protection layer, and particles of a COC (produced by Polyplastics Co., Ltd., TM grade) which are a first hydrophobic resin are charged into the process cartridge P2, as resin particles T1 for forming the channel wall. The other process cartridges shall be empty. Firstly, a pattern of the protection layer 86 is formed on the intermediate transfer member 5 with the use of the process cartridge P1, and subsequently, a pattern of the channel wall 81 is superimposed on the formed pattern of the protection layer 86 with the use of the process cartridge P2 (FIG. 12A). After that, the superimposed pattern is transferred from the intermediate transfer member 5, onto the surface on the side to which the cover film 101 is not bonded of the porous substrate S1-2 to which the cover film 101 is bonded (FIG. 12B).

Figure 12C:
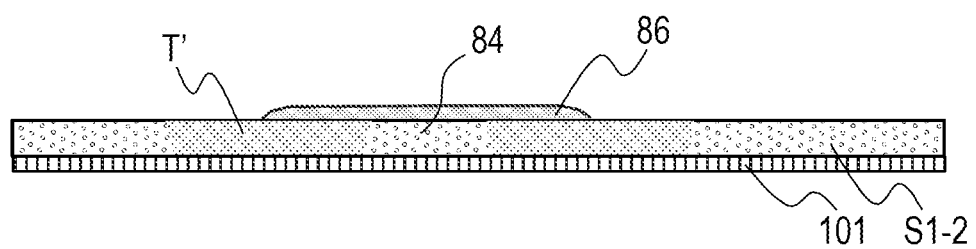

The porous substrate S1-2 to which this pattern has been transferred is heated in a heating process under conditions of 200° C. for 2 minutes, and thereby, a microchannel device is obtained in which the protection layer 86 is provided on the channel 82 sandwiched by the permeated resins T' (FIG. 12C).

For information, in consideration of the result of Example 5, it is preferable that the storage elastic modulus G' of the resin particle T2 for forming the protection layer is 20 Pa or higher at a temperature in the heating process. In the above Example, the channel 82 and the protection layer 86 are formed by use of only the two process cartridges P1 and P2, but the protection layer 86 with the use of another resin can be further formed with the use of the empty process cartridges P3 and P4.

Example 9

In Examples 1 to 8, an oven was used as the heating unit in the heating process, but in the present Example, a heating and pressurizing type of unit is used.

Figure 13:
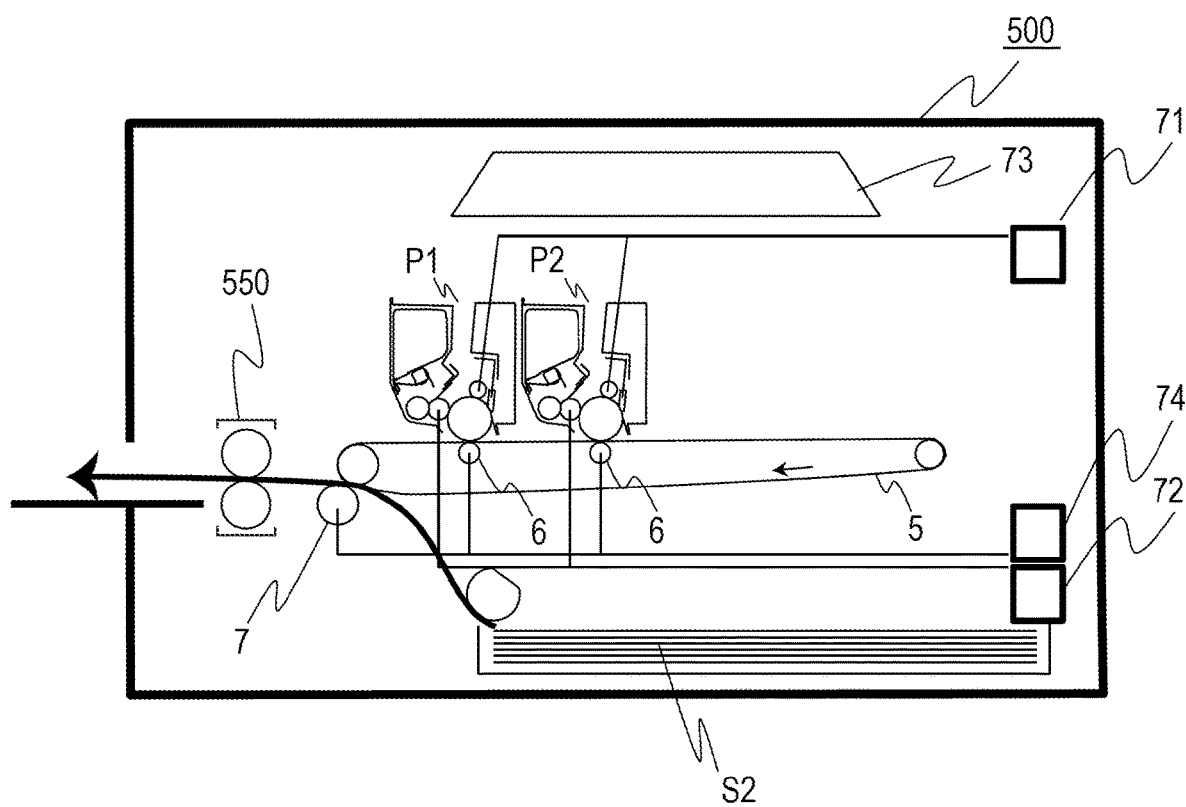
FIG. 13 is a schematic diagram of a channel pattern forming unit in Example 9.

The configuration of the whole channel pattern forming unit will be described below with reference to FIG. 13. FIG. 13 is a cross-sectional view illustrating a schematic configuration of a channel pattern forming unit 500, and illustrates each configuration briefly.

In the channel pattern forming unit 500, there are horizontally arranged a first process cartridge P1 having a developer TB for fixing and separation, which will be described later, and a second process cartridge P2 having the resin particles T1 for forming a channel wall; and a fixing unit 550 is also provided. The resin particle A was used as the resin particle T1 for forming the channel wall.

Firstly, a layer of the developer TB for fixing and separation is formed into the same shape as that of the channel wall pattern, on the intermediate transfer member 5, by use of the process cartridge P1. Next, a channel wall pattern is superimposed on the formed layer of the developer TB for fixing and separation, by use of the process cartridge P2. After that, the formed pattern is transferred from the intermediate transfer member 5 onto the porous substrate S1.

The channel pattern formed on the porous substrate S1 passes through a heating and pressurizing process by the fixing unit 550; and thereby the resin particles T1 for forming the channel wall permeate into the porous substrate S1, and become the microchannel device having the channel wall 81 that is surrounded by the hydrophobic wall. Note that the layer of the developer TB for fixing and separation is a layer for preventing the molten resin particles T1 for forming the channel wall from attaching to the fixing member, and that the placement amount may be a very small amount of about 0.1 mg/cm$^2$.

The fixing unit 550 may be any unit as long as the unit can raise the temperature of the resin particles to a temperature range in which permeation is satisfactorily performed, and units can be used that are generally used in image forming apparatuses by the electrophotographic method. Among the units, a film type of fixing unit as illustrated in FIG. 14 is preferable, from the viewpoint of not disturbing the channel, because it is preferable that fixing is performed at a low pressure.

The film type of fixing unit 550 illustrated in FIG. 14 will be briefly described below. A heating rotator 552 is brought into pressure contact with a pressurizing roller 551 through a heating film 554. The heating film 554 that is sandwiched by the pressurizing roller 551, the support holder 555 and the plate-shaped heating element 553 is driven around the support holder 555 and an unillustrated fixing stay, with respect to the pressurizing roller 551. The pressurizing roller 551 is formed of a core metal 556 made from aluminum or iron, an elastic layer 557 on the outer side thereof, and a release layer 558 covering the surface of the elastic layer 557.

In addition, the developer TB for fixing and separation may be any developer that is generally used as a toner for an image forming apparatus by an electrophotographic method, and is preferably a developer that contains a release agent while using a thermoplastic resin as a binder resin. However, a colorant contained in the general toner is not necessary.

In addition, it is acceptable to perform such a complex heating process as to use a heating process using a heating and pressurizing type of unit as a preliminary heating process, and then perform a main heating process using an oven.

Example 10

Figure 15A:
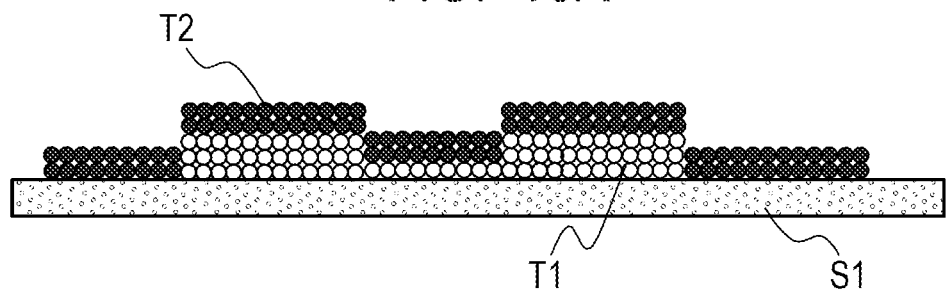
FIGS. 15A, 15B, 15C, and 15D are explanatory diagrams for illustrating the channel formation in Example 10.
Figure 15B:
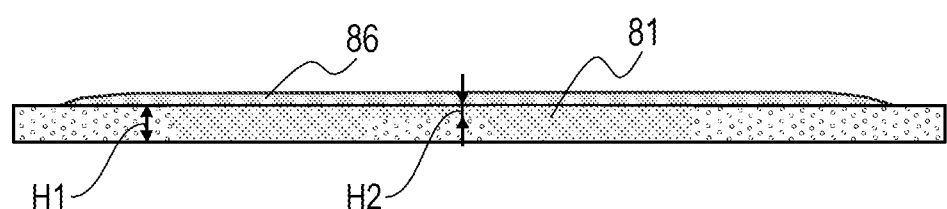
Figure 15C:
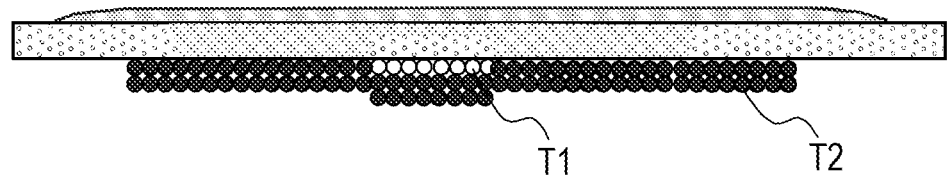
Figure 15D:
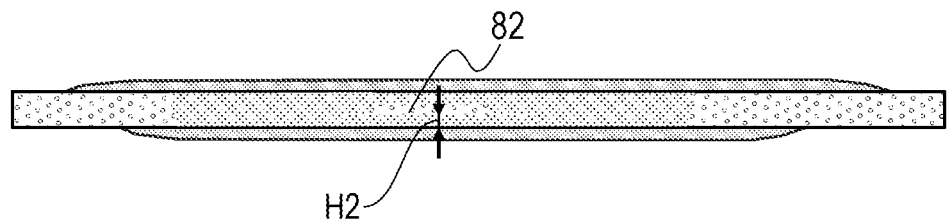

In Example 10, the techniques were used in combination, which were the technique of forming a protection layer with the use of the developers having different storage elastic moduli G in Example 8 and the technique of forming a protection layer by changing the placement amount in Example 7. Firstly, in the front surface channel pattern forming process, the resin particles T1 for forming the channel wall and the resin particles T2 for forming the protection layer were placed on the front surface of the porous substrate S1 of which the thickness H1 was 0.08 mm. At this time, the amount of the resin particles T1 for forming the channel wall was adjusted so as to be different in between the channel pattern and the channel wall pattern (FIG. 15A). Next, the substrate was subjected to the surface fixing process. The state is illustrated in FIG. 15B. The resin particles T1 for forming the channel wall attached to the front side of the porous substrate S1 melt by heating, permeate into the inside of the porous substrate S1, and form the channel wall 81. However, at this time, the height H2 of the permeated resin is 0.02 mm, because the amount of the resin particles T1 for forming the channel wall in the channel portion is small with respect to the thickness of the porous substrate S1, and the resin does not reach the back side of the porous substrate S1. In this way, while the protection layer 86 was placed on the surface of the porous substrate S1, the protection layer 86 was also formed on the surface side of the inside of the porous substrate S1 (FIG. 15B). Next, in the same manner as on the front surface, the protection layer 86 is formed in the back surface channel pattern forming process (FIG. 15C) and in the back surface fixing process, and thereby, a microchannel device is obtained in which the channel 82 is strongly protected by the protection layers 86 (FIG. 15D). The height H2 of the resin that has permeated in the back surface also becomes 0. 02 mm, and a height of the channel 82 of about 0. 04 mm can be ensured.

Example 11

In the present Example, a microchannel device is produced in which a cover layer having a reduced printing rate is provided on the surface of the inspection liquid portion. The protection layer was formed as a solid image having a printing rate of 100%, but when a cover layer is provided on the surface of the inspection liquid portion, the printing rate is appropriately adjusted in a range of 10% to 90%. By the cover layer being provided on the surface of the inspection liquid portion, the amount of the inspection liquid that flows into the inspection liquid portion can be controlled. When the inflow of the inspection liquid is desired to be greatly decreased, the printing rate of the cover layer may be increased, and when the inflow of the inspection liquid is desired to be slightly decreased, the printing rate of the cover layer may be decreased.

Specific examples of methods for producing the microchannel device in which a cover layer is provided on the inspection liquid portion will be described below.

Figure 16:
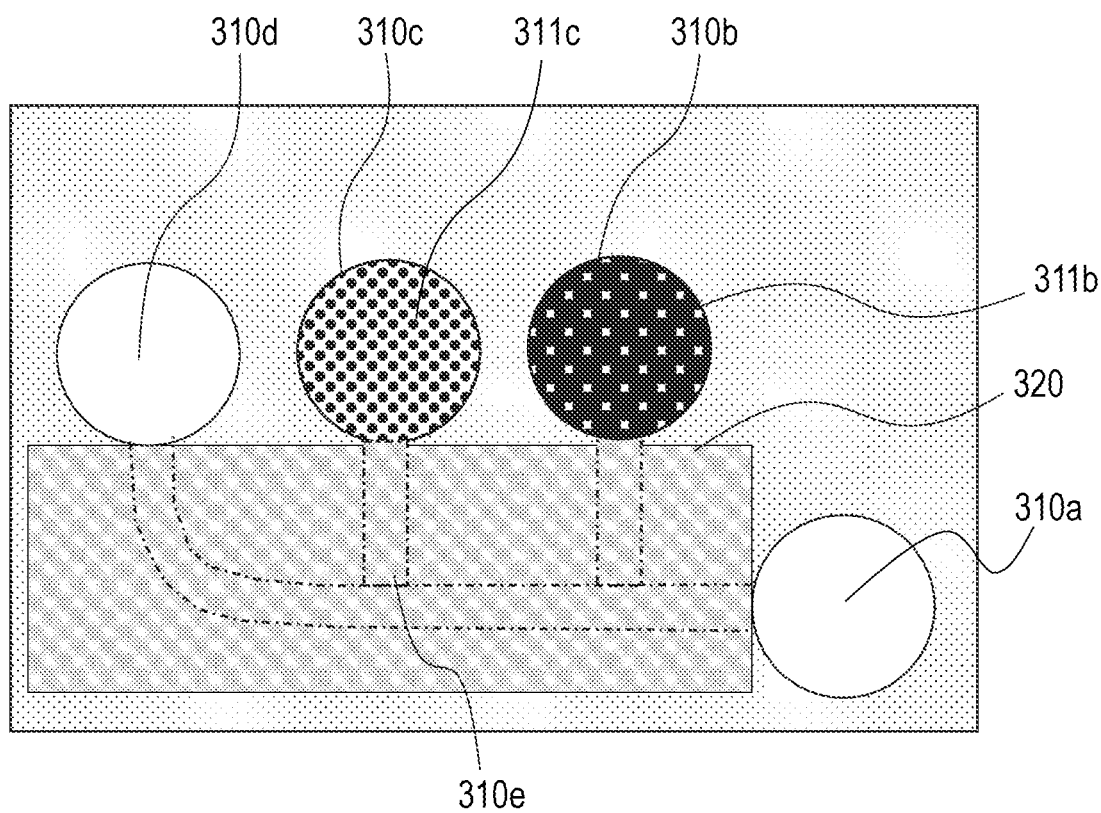
FIG. 16 is a view of a microchannel device provided with a cover layer and a protection layer in Example 11.

Firstly, in the same manner as in Example 1, the resin particles A were placed on the porous substrate, were melted, and were allowed to permeate into the porous substrate, and a channel wall was formed so as to become the channel pattern of FIG. 4B. Subsequently, a microchannel device illustrated in FIG. 16 was produced in the following way. Firstly, in the same manner as in the process of forming the protection layer in Example 5, the resin particles A for the protection layer are placed so as to cover the channel 310e at a printing rate of 100%; on the inspection liquid portion 310c, the resin particles A for the cover layer are placed at a printing rate of 50%; and on the inspection liquid portion 310b, the resin particles A for the cover layer are placed at a printing rate of 80%. After that, heating was performed at 120° C. for 2 minutes, and the protection layer 320 and the cover layers 311b and 311c were formed on the surface of the porous substrate.

In this microchannel device, reagents are allowed to permeate into the reagent portion 310a, and a test agent is attached to the inspection liquid portions 310b to 310d. The microchannel device can be used in such a way that in a case where a large amount of the inspection liquid is required, the inspection liquid is attached from the inspection liquid portion 310d, on the other hand, in a case where it is desired to control the inflow of the inspection liquid to a small amount, for example, about half, the inspection liquid is attached from the inspection liquid portion 310c, and in a case where a further small amount is desired, the inspection liquid is attached from the 310b. The inflow becomes about 50% when the pattern of the cover layer printed on the inspection liquid portion is a pattern having a printing rate of 50%, and becomes about 20% when the pattern has a printing rate of 80%.

According to one aspect of the present disclosure, there can be provided a method for producing a micro channel that has high hydrophobicity, high solvent resistance as well, and also resistance to heat and damage, with the use of a high-viscosity material, on demand, at a low cost, while having high productivity.

According to another aspect of the present disclosure, there can be provided a method for forming a highly accurate channel pattern in which blur is suppressed, in the porous substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A method for producing a microchannel device that has a channel sandwiched between channel walls formed in an inside of a porous substrate, comprising:

placing a first hydrophobic resin on a surface of the porous substrate to form a channel pattern on the surface of the porous substrate; and melting the first hydrophobic resin by heat to allow the first hydrophobic resin to permeate into the inside of the porous substrate, thereby forming a channel wall in the inside of the porous substrate, wherein when the channel wall is formed, the first hydrophobic resin is allowed to permeate at a temperature at which a storage elastic modulus G' of the first hydrophobic resin is 14 Pa or lower, and a loss elastic modulus G" thereof is 10 Pa or higher.

2. The method according to claim 1, wherein a water absorption rate of the first hydrophobic resin is 1% or lower.

3. The method according to claim 2, wherein the water absorption rate of the first hydrophobic resin is 0.1% or lower.

4. The method according to claim 1, wherein a melt viscosity of the first hydrophobic resin at 100° C. is 1000 Pa·s or higher.

5. The method according to claim 1, wherein the first hydrophobic resin is a cyclic olefin copolymer.

6. The method according to claim 5, wherein the first hydrophobic resin further comprises a plastic component.

7. The method according to claim 1, wherein a protection layer is formed so as to cover the channel or close a surface side of the channel, on the surface of the porous substrate.

8. The method according to claim 7, wherein, after forming the channel wall in the inside of the porous substrate using the first hydrophobic resin, a second hydrophobic resin that is the same as or different from the first hydrophobic resin is placed on the surface of the porous substrate; and the second hydrophobic resin is melted to form the protection layer.

9. A method for producing a microchannel device that has a channel sandwiched between channel walls formed in an inside of a porous substrate, comprising:

placing a first hydrophobic resin on a surface of the porous substrate by an electrophotographic method to form a channel pattern on the surface of the porous substrate; and melting the first hydrophobic resin by heat to allow the first hydrophobic resin to permeate into the inside of the porous substrate, thereby forming a channel wall in the inside of the porous substrate, wherein a protection layer is formed so as to cover the channel or close a surface side of the channel, on the surface of the porous substrate, wherein the first hydrophobic resin is allowed to exist in both of a region that becomes the channel wall and a region that becomes the channel, in the channel pattern, and an amount of the first hydrophobic resin in the region that becomes the channel wall is controlled so as to be larger than an amount of the first hydrophobic resin in the region that becomes the channel, and wherein the first hydrophobic resin is melted to form the channel wall in the inside of the porous substrate, and also to form the protection layer so as to cover the surface side of the channel.

10. The method according to claim 9, wherein the amount of the first hydrophobic resin in the region that becomes the channel is controlled to 25 to 75% by mass of the amount of the first hydrophobic resin in the region that becomes the channel wall.

11. A method for producing a microchannel device that has a channel sandwiched between channel walls formed in an inside of a porous substrate, comprising:

placing a first hydrophobic resin on a surface of the porous substrate by an electrophotographic method to form a channel pattern on the surface of the porous substrate; and melting the first hydrophobic resin by heat to allow the first hydrophobic resin to permeate into the inside of the porous substrate, thereby forming a channel wall in the inside of the porous substrate, wherein a protection layer is formed so as to cover the channel or close a surface side of the channel, on the surface of the porous substrate, wherein a second hydrophobic resin of which a storage elastic modulus G' is 20 Pa or larger at a temperature at the time when the channel wall is formed, is allowed to exist in a region that becomes the channel, in the channel pattern, and wherein the first hydrophobic resin and the second hydrophobic resin are melted to form the channel wall that is formed of the first hydrophobic resin in the inside of the porous substrate, and also to form the protection layer formed of the second hydrophobic resin so as to cover the channel.

* * * * *